(12) United States Patent
Kim et al.

(10) Patent No.: US 12,120,937 B2
(45) Date of Patent: Oct. 15, 2024

(54) ELECTRONIC DEVICE

(71) Applicant: Samsung Display Co., Ltd., Yongin-Si (KR)

(72) Inventors: Changbum Kim, Pyeongtaek-si (KR); Jina Kang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/871,418

(22) Filed: Jul. 22, 2022

(65) Prior Publication Data
US 2023/0138450 A1    May 4, 2023

(30) Foreign Application Priority Data
Oct. 28, 2021 (KR) .................. 10-2021-0145699

(51) Int. Cl.
  *G06F 3/041* (2006.01)
  *G06F 3/044* (2006.01)
  *H10K 59/40* (2023.01)

(52) U.S. Cl.
  CPC ........... *H10K 59/40* (2023.02); *G06F 3/0412* (2013.01); *G06F 3/0446* (2019.05); *G06F 2203/04102* (2013.01)

(58) Field of Classification Search
  None
  See application file for complete search history.

(56) References Cited

U.S. PATENT DOCUMENTS

| | | | |
|---|---|---|---|
| 10,379,694 B2 | 8/2019 | Park et al. | |
| 10,901,536 B2 | 1/2021 | Kadowaki et al. | |
| 2015/0002415 A1 | 1/2015 | Lee et al. | |
| 2016/0062519 A1* | 3/2016 | Park ................ | G06F 3/0446 345/173 |
| 2016/0246390 A1* | 8/2016 | Lukanc ............. | G06F 3/0383 |
| 2019/0146602 A1* | 5/2019 | Kadowaki ......... | G06F 3/0383 345/174 |

FOREIGN PATENT DOCUMENTS

| | | |
|---|---|---|
| JP | 6537759 | 7/2019 |
| KR | 10-1489813 | 2/2015 |
| KR | 10-2016-0025443 | 3/2016 |
| KR | 10-2022-0022022 | 2/2022 |

* cited by examiner

*Primary Examiner* — Brian M Butcher
(74) *Attorney, Agent, or Firm* — F. CHAU & ASSOCIATES, LLC

(57) ABSTRACT

An electronic device may include a display layer that displays an image and a sensor layer disposed on the display layer and sensing an external input. The sensor layer includes a plurality of channels equal to M. M is an integer greater than or equal to 5. A sensor driver drives the sensor layer. In an uplink section, the sensor driver provides an uplink signal to X first channels that are continuously arranged and provides an inverse phase signal having an inverse phase of the uplink signal to Y second channels that are continuously arranged. X and Y are integers greater than or equal to 2. Z off channels that are continuously arranged and are positioned between the first channels and the second channels may be turned off. Z is an integer greater than or equal to 1. M is a sum of X, Y and Z.

20 Claims, 19 Drawing Sheets

<First mode>

<Second mode>

ULS

ULSR

ELECTRONIC DEVICE

CROSS-REFERENCE TO RELATED APPLICATIONS

This application claims priority under 35 U.S.C. § 119 to Korean Patent Application No. 10-2021-0145699, filed on Oct. 28, 2021 in the Korean Intellectual Property Office, the disclosure of which is incorporated by reference in its entirety herein.

1. Technical Field

Embodiments of the present disclosure described herein relate to an electronic device having increased image quality and increased sensing sensitivity.

2. Discussion of Related Art

Various multimedia electronic devices include a display device for displaying an image, such as a television (TV), a mobile phone, a tablet computer, a navigation system, and a game console. In addition to a general input method such as a button, a keyboard, and a mouse, electronic devices may include a sensor layer (or an input sensor) capable of providing a touch-based input method that allows a user to input information or commands easily and intuitively.

SUMMARY

Embodiments of the present disclosure provide an electronic device having increased image quality and increased sensing sensitivity.

According to an embodiment of the present disclosure, an electronic device includes a display layer that displays an image. A sensor layer is disposed on the display layer and senses an external input. The sensor layer includes a plurality of channels equal to M. M is an integer greater than or equal to 5. A sensor driver drives the sensor layer. In an uplink section, the sensor driver provides an uplink signal to X first channels that are continuously arranged among the plurality of channels. X is an integer greater than or equal to 2. The sensor driver provides an inverse phase signal having an inverse phase of the uplink signal to Y second channels that are continuously arranged among the plurality of channels. Y is an integer greater than or equal to 2. Z off channels are continuously arranged among the plurality of channels and are positioned between the X first channels and the Y second channels are turned off Z is an integer greater than or equal to 1. M is a sum of X, Y, and Z.

In an embodiment, it a first uplink section, the plurality of channels may be sequentially defined as the X first channels, the Z off channels, and the Y second channels, and in a second uplink section subsequent to the first uplink section, the plurality of channels may be sequentially defined as the Y second channels, the Z off channels, and the X first channels.

In an embodiment, X is greater than Y.

In an embodiment, M is equal to 2n. N is a positive integer. X is equal to n.

In an embodiment, M is 2n+1. N is a positive integer. X is n+1.

In an embodiment, a sensing area and a peripheral area may be defined in the sensor layer, and the X first channels may overlap at least half of the sensing area.

In an embodiment, a sensing area and a peripheral area may be defined in the sensor layer, and the Z off channels and the Y second channels together may overlap less than a halt of the sensing area.

In an embodiment, in the uplink section, both the uplink signal and the inverse phase signal may not be provided to the Z off channels.

In an embodiment, a first off channel operating as an off channel among the plurality of channels in a first uplink section and a second off channel operating as an off channel among the plurality of channels in a second uplink section subsequent to the first uplink section may be different from each other.

In an embodiment, X may be greater than or equal to half of M and Y may be less than the half of M.

In an embodiment, Z may be one or two.

In an embodiment, the sensor layer may include a plurality of electrodes that each extends in a first direction and are arranged in a second direction intersecting the first direction and a plurality of cross electrodes that each extends in the second direction and are arranged in the first direction, and each of the plurality of channels may extend in the first direction and may be arranged in the second direction and respectively corresponds to one of the plurality of electrodes.

The sensor driver may be driven selectively in a first mode that detects a passive input based on a change in a mutual capacitance formed between the plurality of electrodes and the plurality of cross electrodes or a second mode that detects an active input based on a change in a capacitance of at least one of the plurality of electrodes and the plurality of cross electrodes.

In an embodiment, each of the first mode and the second mode may include the uplink section.

According to an embodiment of the present disclosure, an electronic device includes a display layer that displays as image. A sensor layer is disposed on the display layer and senses an external input. The sensor layer includes a plurality of channels. A sensor driver drives the sensor layer. In each of uplink sections, the sensor driver provides an uplink signal to a plurality of first channels that are continuously arranged among the plurality of channels and provides an inverse phase signal having an inverse phase of the uplink signal to a plurality of second channels that are continuously arranged among the plurality of channels that are different from the plurality of first channels. The sensor driver does not provide the uplink signal and the inverse phase signal to off channels among the plurality of channels that are defined between the plurality of first channels and the plurality of second channels. The uplink sections include a first uplink section and a second uplink section subsequent to the first uplink section. In the first uplink section, the plurality of channels are sequentially defined as the plurality of first channels, the off channels, and the plurality of second channels, and in the second uplink section, the plurality of channels are sequentially defined as the plurality of second channels, the off channels, and the plurality of first channels.

In an embodiment, the number of the plurality of channels may be equal to a sum of a number of the plurality of first channels, a number of the off channels, and a number of the plurality of second channels, and the number of the plurality of first channels may be greater than the number of the plurality of second channels.

In an embodiment, a number of the plurality of channels is 2n and a number of the plurality of channels is 2n+1. N is a positive integer. Alternatively, the number of the plurality of first channels may be n+1. N is a positive integer.

In an embodiment, a number of the off channels may be one or two.

In an embodiment, the sensor layer may include a plurality of electrodes that each extends in a first direction and is arranged in a second direction intersecting the first direction, and a plurality of cross electrodes that each extends in the second direction and is arranged in the first direction, and each of the plurality of channels may extend in the first direction and is arranged in the second direction and respectively corresponds to one of the plurality of electrodes.

In an embodiment, the sensor driver may be driven selectively in a first mode that detects a passive input based on a change in a mutual capacitance formed between the plurality of electrodes and the plurality of cross electrodes or a second mode that detects an active input based on a change in a capacitance of at least one of the plurality of electrodes and the plurality of cross electrodes, and the first mode and the second mode may include the uplink sections.

BRIEF DESCRIPTION OF THE DRAWINGS

The above and other objects and features of the present disclosure will become apparent by describing in detail embodiments thereof with reference to the accompanying drawings.

DETAILED DESCRIPTION OF EMBODIMENTS

Figure 1A:
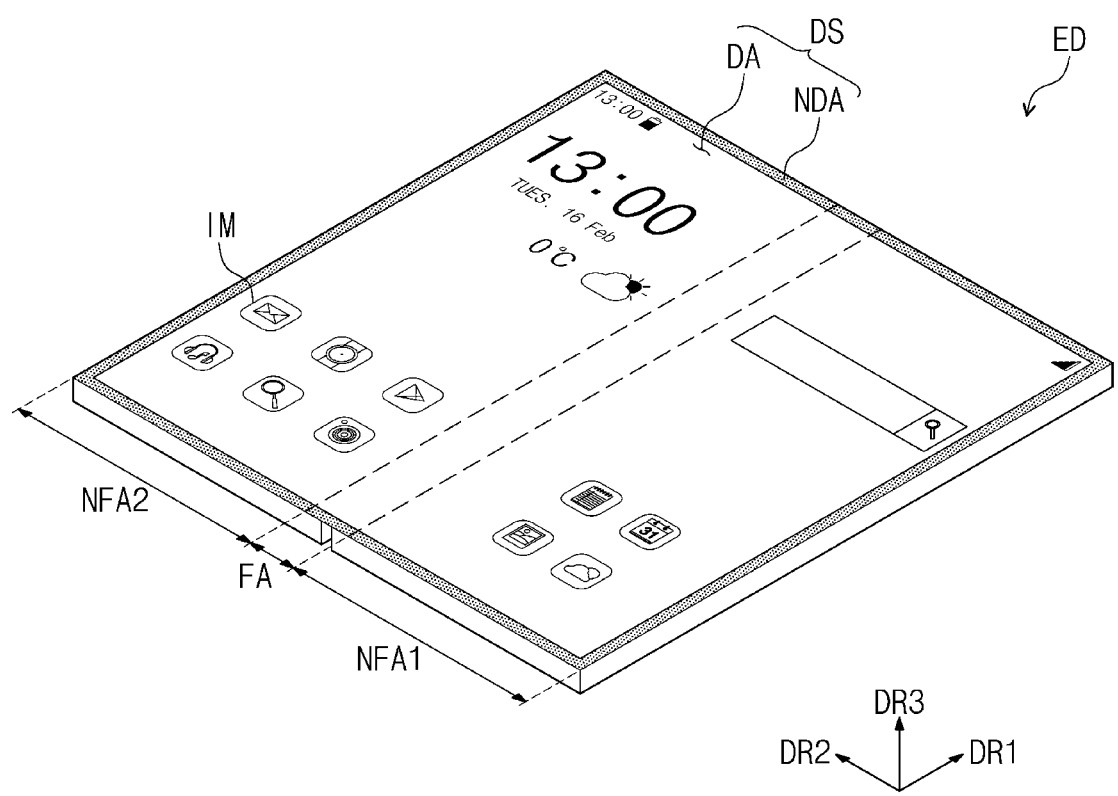
FIGS. 1A and 1B are perspective views of an electronic device according to embodiments of the present disclosure.

In the present specification, the expression that a first component (or area, layer, part, portion, etc.) is "on", "connected with", or "coupled to" a second component means that the first component is directly on, connected with, or coupled to the second component or means that a third component is interposed therebetween. The expression that a first component (or area, layer, part, portion, etc.) is "directly on", "directly connected with", or "directly coupled to" a second component means that a third component is not interposed therebetween.

The same reference numerals refer to the same components. Further, in the drawings, the thickness, the ratio, and the dimension of components are exaggerated for effective description of technical contents. The expression "and/or" includes one or more combinations which associated components are capable of defining.

Although the terms "first", "second", etc. may be used to describe various components, the components should not be limited by the terms. The terms are only used to distinguish one component from another component. For example, without departing from the scope of embodiments of the present disclosure, a first component may be referred to as a second component, and similarly, the second component may be also referred to as the first component. Singular expressions include plural expressions unless clearly otherwise indicated in the context.

Also, the terms "under", "below", "on", "above", etc. are used to describe the correlation of components illustrated in drawings. The terms that are relative in concept are described based on a direction illustrated in drawings.

It will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof.

Unless otherwise defined, all terms (including technical terms and scientific terms) used in the present specification have the same meaning as commonly understood by those skilled in the art to which the present disclosure belongs. Furthermore, terms including those defined in the dictionaries commonly used should be interpreted as having a meaning consistent with the meaning in the context of the related technology and should not be interpreted in overly ideal or overly formal meanings unless explicitly defined herein.

Hereinafter, embodiments of the present disclosure will be described with reference to accompanying drawings.

Figure 1B:
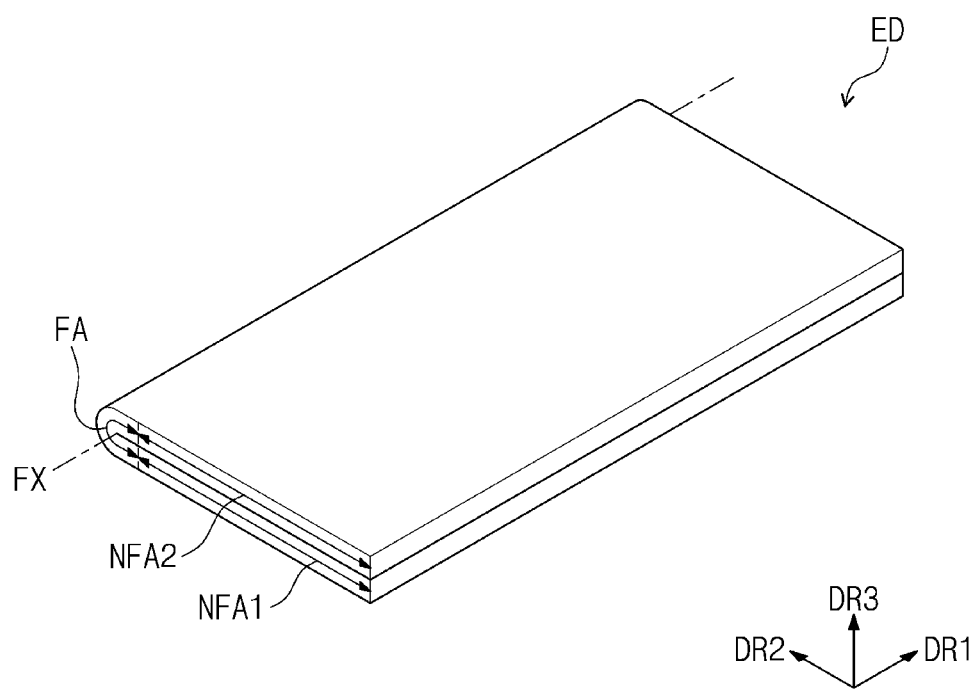

FIGS. 1A and 1B are perspective views of an electronic device ED according to an embodiment of the present disclosure. FIG. 1A illustrates an unfolded state of the electronic device ED, and FIG. 1B illustrates a folded state of the electronic device ED.

Referring to FIGS. 1A and 1B, the electronic device ED may be a device that is activated according to an electric signal. For example, in an embodiment the electronic device ED may be a cellular phone, a portable mobile phone, a tablet, a car navigation system, a game console, or a wearable device. However, embodiments of the present disclosure are not necessarily limited thereto. FIGS. 1A and 1B illustrate that the electronic device ED is a foldable mobile phone. However, embodiments of the present disclosure are not necessarily limited thereto.

The electronic device ED according to an embodiment of the present disclosure may include a display surface DS extending in a plane defined by a first direction DR1 and a second direction DR2 intersecting the first direction DR1. The electronic device ED may provide an image IM to a user through the display surface DS. In the embodiment of FIG. 1A, the image IM is software application icons and a clock, temperature and calendar window. However embodiments of the present disclosure are not necessarily limited thereto and the image IM may be various different subject matter.

The display surface DS may include a display area DA and a non-display area NDA around the display area DA. The image IM may be displayed M the display area DA and the image IM may not be displayed in the non-display area NDA. The non-display area NDA may surround the display area DA. However, embodiments of the present disclosure are not necessarily limited thereto. The shape of the display area DA and the shape of the non-display area NDA may be variously changed in some embodiments.

Hereinafter, a direction substantially perpendicular to a plane defined by the first direction DR1 and the second direction DR2 is defined as a third direction DR3 which may be a thickness direction of the electronic device ED. Further, in the present specification, the meaning of "on a plane" may be defined as a state of "when viewed in the third direction DR3".

The electronic device ED may include a folding area FA (or foldable area) and a plurality of non-folding areas. The non-folding areas may include the first non-folding area NFA1 and the second non-folding area NFA2. The folding area FA may be disposed between the first non-folding area NFA1 and the second non-folding area NFA2. In an embodiment, the first non-folding area NFA1, the folding area FA, and the second non-folding area NFA2 may be sequentially defined in the electronic device ED in the second direction DR2. However, embodiments of the present disclosure are not necessarily limited thereto.

As illustrated in FIG. 1B, the folding area FA may be folded with respect to a folding axis FX parallel to the first direction DR1. The folding area FA may extend in the first direction DR1. The folding area FA may be folded to have a predetermined curvature and a predetermined radius of curvature. In an embodiment, the first non-folding area NFA1 and the second non-folding area NFA2 may face each other, and the electronic device ED may be inner-folded so that the display surface DS is not exposed to the outside.

In an embodiment of the present disclosure, the electronic device ED may be outer-folded so that the display surface DS is exposed to the outside. In an embodiment of the present disclosure, the electronic device ED may enable both an inner folding operation and an outer folding operation from an unfolding operation. However, embodiments of the present disclosure are not necessarily limited thereto. In an embodiment of the present disclosure, the electronic device ED may be configured to perform at least two of the unfolding operation, the inner folding operation, and the outer folding operation.

Although the foldable electronic device ED has been described as an example in FIGS. 1A and 1B, embodiments of the present disclosure are not necessarily limited thereto. For example, the electronic device ED may be changed into various electronic devices such as a rigid electronic device, for example, an electronic device in which the folding area FA is not defined, a rollable electronic device, or a slidable electronic device.

Figure 2:
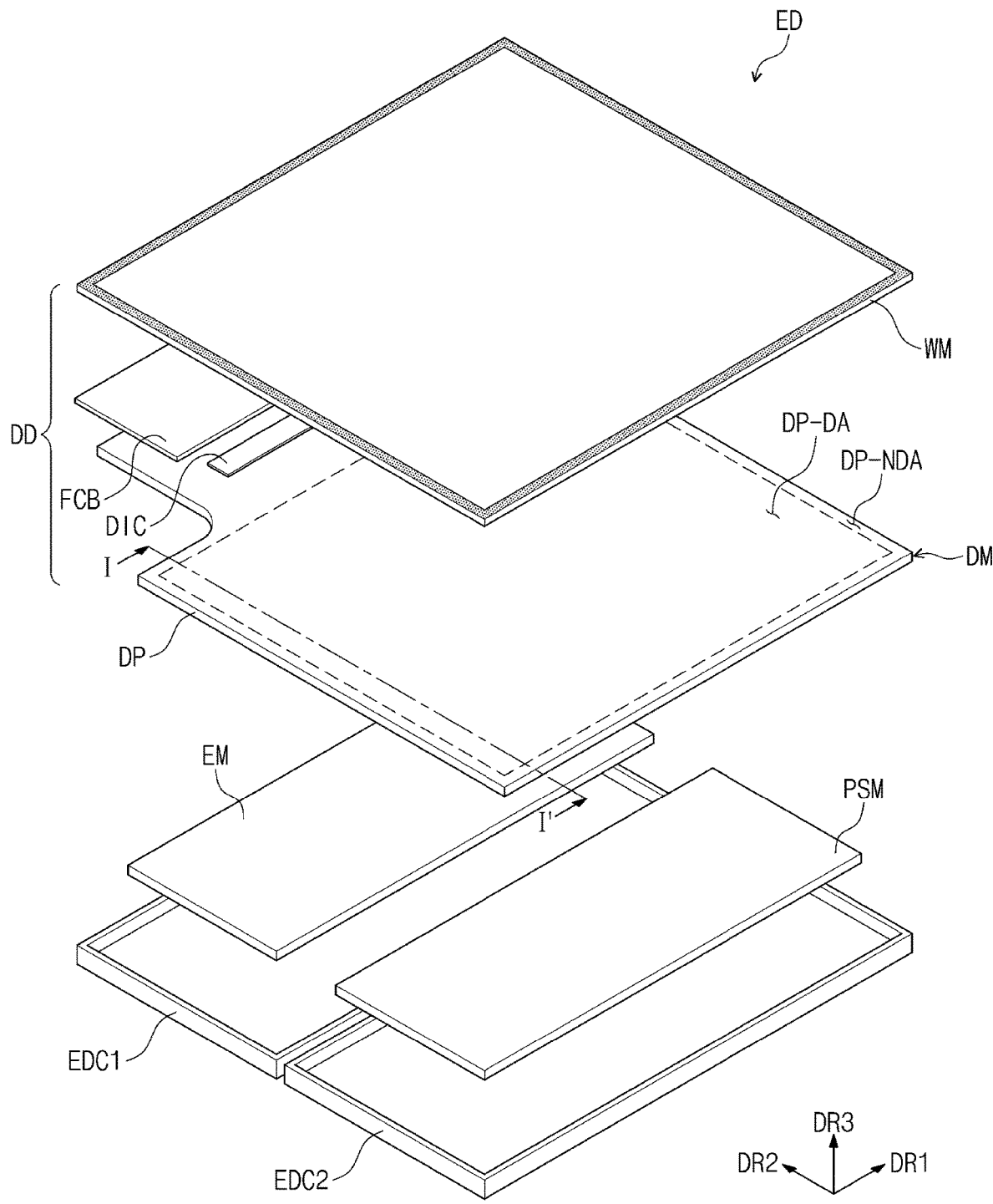
FIG. 2 is an exploded perspective view of the electronic device according to an embodiment of the present disclosure.

FIG. 2 is an exploded perspective view of the electronic device ED according to an embodiment of the present disclosure.

Referring to FIG. 2, the electronic device ED may include a display device DD, an electronic module EM, a power supply module PSM, and cases EDC1 and EDC2. In an embodiment, the electronic device ED may further include a mechanism structure for controlling a folding operation of the display device DD.

The display device DD generates an image and senses an external input. The display device DD includes a window module WM and a display module DM. The window module WM provides a front surface of the electronic device ED.

The display module DM may include at least a display panel DP. Although the display module DM is illustrated as being identical to the display panel DP in FIG. 2, the display module DM may be substantially a stacked structure in which a plurality of components are stacked. The stacked structure of the display module DM will be described below in detail.

The display panel DP includes a display area DP-DA and a non-display area DP-NDA corresponding to the display area DA (see FIG. 1A) and the non-display area NDA (see FIG. 1A) of the electronic device ED. In the present specification, an expression "an area/part and an area/part correspond to each other" means that the area/part and the area/part overlap each other (e.g., in the third direction DR3) and is not limited to the same area. The display module DM may include a drive chip DIC disposed on the non-display area DP-NDA. The display module DIM may further include a flexible circuit film FCB coupled to the non-display area DP-NDA.

The drive chip DIC may include drive elements, for example, a data drive circuit, for driving pixels of the display panel DP. Although a structure in which the drive chip DIC is mounted on the display panel DP is illustrated in FIG. 2, embodiments of the present disclosure are not necessarily limited thereto. For example, the drive chip DIC may be mounted on the flexible circuit film FCB.

The electronic module EM includes at least a main driver. In an embodiment, the electronic module EM pray include at least one selected from a wireless communication module, a camera module, a proximity sensor module, an image input module, a sound input module, a sound output module, a memory, and an external interlace module. The electronic module EM is electrically connected to the power supply module PSM.

The main driver (e.g., a main controller) controls the overall operation of the electronic device ED. For example, the main driver activates or deactivates the display device DD in accordance with a users input. The main driver may control operations of the display device DD and other modules. The main driver may include at least one microprocessor.

The cases EDC1 and EDC2 accommodate the display module DM, the electronic module EM, and the power supply module PSM. Although it is illustrated as an example that the two cases EDC1 and EDC2 are separated from each other, embodiments of the present disclosure are not necessarily limited thereto. For example, in an embodiment the electronic device ED may further include a hinge structure for connecting the two cases EDC1 and EDC2. The cases EDC1 and EDC2 may be coupled to the window module WM. The cases EDC1 and EDC2 protect components accommodated in the cases EDC1 and EDC2, such as the display module DM, the electronic module EM, and the power supply module PSM.

Figure 3A:
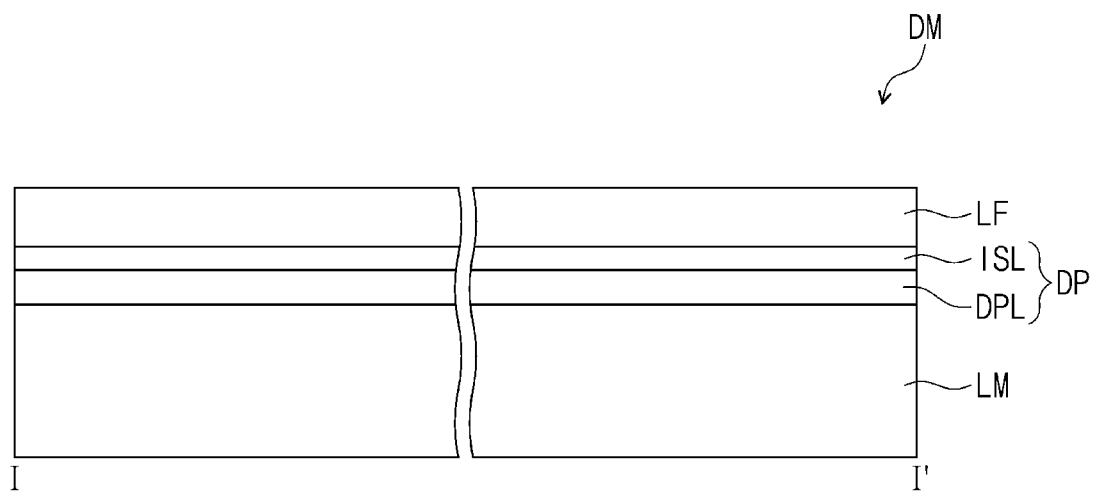
FIG. 3A is a cross-sectional view of a display module according to an embodiment of the present disclosure.

FIG. 3A is a cross-sectional view of the display module DM according to an embodiment of the present disclosure.

Referring to FIG. 3A, the display module DM may include the display panel DP, an optical film LF disposed on the display panel DP, and a lower member LM disposed below the display panel DP. The display panel DP may include a display layer DPL and a sensor layer ISL disposed on the display layer DPL. In an embodiment, an adhesive layer may be disposed between the display layer DPL and the sensor layer ISL.

The display layer DPL may be a component which substantially generates an image. The display layer DPL may be a light emitting display layer. For example, in an embodiment the display layer DPL may be an organic light emitting display layer, an inorganic light emitting display layer, an organic inorganic light emitting display layer, a quantum dot display layer, a micro-light emitting diode (LED) display layer, or a nano-LED display layer. However, embodiments of the present disclosure are not necessarily limited thereto.

The sensor layer ISL may be disposed on the display layer DPL. The sensor layer ISL may sense an external input applied from an external unit. The sensor layer ISL may be an external sensor attached to the display layer DPL, and the sensor layer ISL may be an integrated sensor continuously formed during a manufacturing process of the display layer DPL.

The optical film LF may reduce a reflectance of light incident from the outside. In an embodiment, the optical film LF may include a phase retarder and/or a polarizer. The optical film LF may include at least one polarizing film. Alternatively, the optical film LF may include color filters. The color filters may have a predetermined arrangement. The arrangement of the color filters may be determined in consideration of emission colors of pixels included in the display layer DPL. Further, the optical film LF may further include a black matrix adjacent to the color filters. Alternatively, the optical film LF may include a destructive interference structure. For example, the destructive interference structure may include a first reflective layer and a second reflective layer disposed on different layers. First reflected light and second reflected light reflected from the first reflective layer and the second reflective layer, respectively, may destructively interfere, and thus external light reflectance may be reduced. In an embodiment, the optical film LF may be omitted.

The lower member LM may include various functional members. In an embodiment, the lower member LM may include at least one selected from a light blocking layer that blocks light incident in the display layer DPL, a shock absorption layer that absorbs an external shock, a support layer that supports the display layer DPL, a heat dissipation layer that emits heat generated from the display layer DPL, and the like.

Figure 3B:
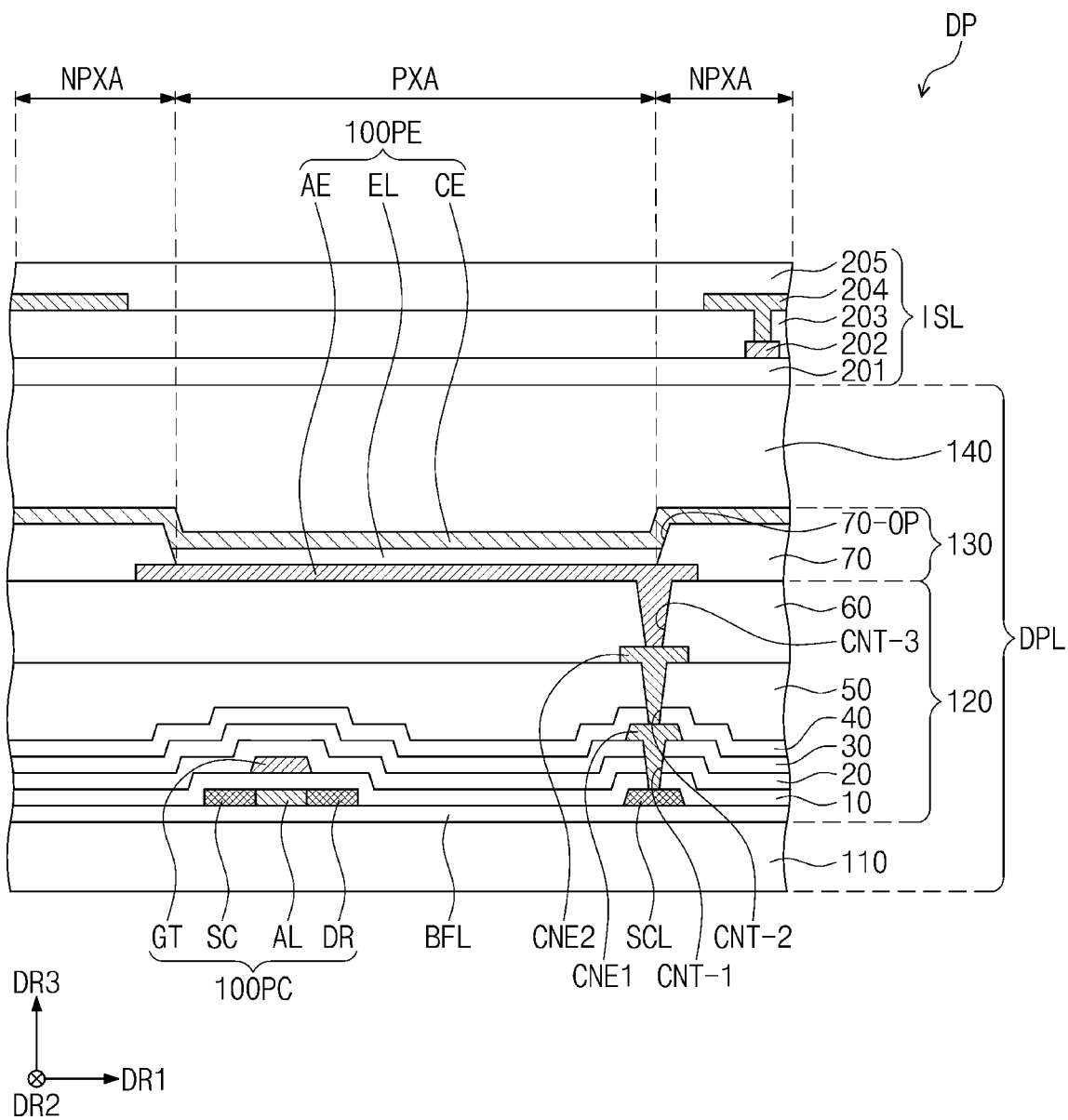
FIG. 3B is a cross-sectional view of a display panel according to an embodiment of the present disclosure.

FIG. 3B is a cross-sectional view of the display panel DP according to an embodiment of the present disclosure.

Referring to FIG. 3B, the display layer DPL may include a base layer 110, a circuit layer 120, a light emitting element layer 130, and an encapsulation layer 140.

The base layer 110 may be a member that provides a base surface on which the circuit layer 120 is disposed. In an embodiment, the base layer 110 may be a glass substrate, a metal substrate, a polymer substrate, or the like. However, embodiments of the present disclosure are not necessarily limited thereto, and the base layer 110 may be an inorganic layer, an organic layer, or a composite material layer.

At least one inorganic layer is formed on an upper surface of the base layer 110. The inorganic layer may include at least one compound selected from aluminum oxide, titanium oxide, silicon oxide, silicon nitride, silicon oxynitride zirconium oxide, and hafnium oxide. The inorganic layer may be formed of multiple layers. The multiple inorganic layers may constitute a barrier layer and/or a buffer layer. In an embodiment, the display layer DPL is illustrated as including a buffer layer BEL.

The buffer layer BFL may increase a bonding force between the base layer 110 and a semiconductor pattern. The buffer layer BFL may include at least one compound selected from silicon oxide, silicon nitride, and silicon oxynitride. For example, the buffer layer BFL may include a structure in which a silicon oxide layer and a silicon nitride layer are stacked alternately.

The semiconductor pattern may be disposed on the buffer layer BFL. The semiconductor pattern may include polysilicon. However, embodiments of the present disclosure are not necessarily limited thereto, and the semiconductor pattern may include amorphous silicon, low-temperature polycrystalline silicon, or an oxide semiconductor.

FIG. 3B merely illustrates a portion of the semiconductor pattern, and the semiconductor pattern may be further disposed in another area. The semiconductor pattern may be disposed in a specific rule across the pixels. The semiconductor pattern may have a different electrical property depending on whether or not the semiconductor is doped. The semiconductor pattern may include a first area having higher conductivity and a second area having lower conductivity. In an embodiment, the first area may be doped with an N-type dopant or a P-type dopant. A P-type transistor may include a doping area doped with the P-type dopant, and an N-type transistor may include a doping area doped with the N-type dopant. The second area may be a non-doping area or may be an area doped at a concentration lower than the concentration of the first area.

A conductivity of the first area is greater than a conductivity of the second area, and the first area may substantially serve as an electrode or a signal line. The second area may correspond to an active area (or a channel) of a transistor substantially. For example, a portion of the semiconductor pattern may be an active area of a transistor, another portion of the semiconductor pattern may be a source area or a drain area of the transistor, and still another portion of the semiconductor pattern may be a connection electrode or a connection signal line.

In an embodiment, each of pixels may have an equivalent circuit including 7 transistors, one capacitor, and a light emitting element, and the equivalent circuit of the pixel may be modified into various forms. FIG. 3B illustrates one transistor 100PC and one light emitting element 100PE included in the pixel as an example.

A source SC, an active area AL, and a drain DR of the transistor 100PC may be formed from the semiconductor pattern. The source SC and the drain DR may extend from the active area AL in opposite directions on a cross section (e.g., in the first direction DR1). FIG. 3B illustrates a portion of a connection signal wire SCL formed from the semiconductor pattern. In an embodiment, the connection signal wire may be connected to the drain DR of the transistor 100PC in a plan view.

A first insulating layer 10 may be disposed on the buffer layer BFL. The first insulating layer 10 may overlap a plurality of pixels in common and may cover the semiconductor pattern. The first insulating layer 10 may be an inorganic layer and/or an organic layer and may have a single-layer structure or a multi-layer structure. In an embodiment, the first insulating layer 10 may include at least one compound selected from an aluminum oxide, a titanium oxide, a silicon oxide, a silicon nitride, a silicon oxynitride, a zirconium oxide, and a hafnium oxide. In an embodiment, the first insulating layer 10 may be a single silicon oxide layer. The first insulating layer 10 and an insulating layer of the circuit layer 120, which will be described below, may be an inorganic layer and/or an organic layer, and may have a single-layer structure or a multi-layer structure. The inorganic layer may include at least one of the above-described materials. However, embodiments of the present disclosure are not necessarily limited thereto.

A gate GT of the transistor 100PC is disposed on the first insulating layer 10. The gate GT may be a part of a metal pattern. The gate GT overlaps the active area AL (e.g., in the third direction DR3). In an embodiment the gate GT may function as a mask in a process of doping the semiconductor pattern.

A second insulating layer 20 may be disposed on the first insulating layer 10 and may cover the gate GT. The second insulating layer 20 may overlap the pixels in common. The second insulating layer 20 may be an inorganic layer and/or an organic layer and may have a single-layer structure or a multi-layer structure. The second insulating layer 20 may include at least one compound selected from silicon oxide, silicon nitride, and silicon oxynitride. In an embodiment, the second insulating layer 20 may have a multi-layer structure including a silicon oxide layer and a silicon nitride layer.

A third insulating layer 30 may be disposed on the second insulating layer 20. The third insulating layer 30 may have a single-layer structure or a multi-layer structure. For example, the third insulating layer 30 may have a multi-layer structure including a silicon oxide layer and a silicon nitride layer.

A first connection electrode CNE1 may be disposed on the third insulating layer 30. The first connection electrode CNE1 may be connected to the connection signal wire SCL through a contact hole CNT-1 passing through the first insulating layer 10, the second insulating layer 20, and the third insulating layer 30.

A fourth insulating layer 40 may be disposed on the third insulating layer 30. The fourth insulating layer 40 may be a single silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE. For example, in an embodiment the light emitting element layer 130 may include an organic light emitting material, an inorganic light emitting material, an organic-inorganic light emitting material, a quantum dot, a quantum rod, a micro-LED, or a nano-LED. Hereinafter, it will be described that the light emitting element 100PE is an organic light emitting element. However, embodiments of the present disclosure are not necessarily limited thereto.

The light emitting element 100PE may include a first electrode AE, a light emitting layer EL, and a second electrode CE.

The first electrode AE may be disposed on the sixth insulating layer 60 (e.g., directly thereon in the third direction DR3). The first electrode AE may be connected to the second connection electrode CNE2 through a contact hole CNT-3 passing through the sixth insulating layer 60.

A pixel defining layer 70 may be disposed on the sixth insulating layer 60 and may cover a portion of the first electrode AE. An opening 70-OP is defined in the pixel defining layer 70. The opening 70-OP of the pixel defining layer 70 exposes at least a portion of the first electrode AE. For example, as shown in FIG. 3B, in an embodiment, the pixel defining layer 70 may cover lateral edges of the first electrode AE and the opening 70-OP may expose a central portion of the first electrode AE.

The display area DA (see FIG. 1A) may include a light emitting area PXA and a non-light emitting area NPXA adjacent to the light emitting area PXA. The non-light emitting area NPXA may surround the light emitting area PXA. In an embodiment, the light emitting area PXA is defined to correspond to a partial area of the first electrode AE, which is exposed by the opening 70-OP.

The light emitting layer EL may be disposed can the first electrode AE. The light emitting layer EL may be disposed in an area corresponding to the opening 70-OP. For example, the light emitting layers EL may be formed separately from the respective pixels. In an embodiment in which the light emitting layers EL are formed separately from the respective pixels, each of the light emitting layers EL may emit light of at least one of a blue color, a red color, and a green color. However, embodiments of the present disclosure are not necessarily limited thereto, and the light emitting layer EL may be connected to the pixels and may be provided in common In this embodiment, the light emitting layer EL may provide blue light or white light.

The second electrode CE may be disposed on the light emitting layer EL. The second electrode CE may have an integral shape and may be disposed in the plurality of pixels in common.

In an embodiment, a hole control layer may be disposed between the first electrode AE and the light emitting layer EL. The hole control layer may be disposed in common in the light emitting area PXA and the non-light emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. In an embodiment, the hole control layer and the electron control layer may be formed in the plurality of pixels in common by using an open mask.

The encapsulation layer 140 may be disposed on the light emitting element layer 130 (e.g., disposed directly thereon in the third direction DR3). In an embodiment, the encapsulation layer 140 may include all inorganic layer, an organic layer, and an inorganic layer sequentially stacked (e.g., in the third direction DR3). However, embodiments of the present disclosure are not necessarily limited thereto and layers constituting the encapsulation layer 140 and the numbers thereof may vary.

The inorganic layers may protect the light emitting element layer 130 from moisture and oxygen, and the organic layer may protect the light emitting element layer 130 from foreign substances such as dust particles. In an embodiment, the inorganic layers may include a silicon nitride layer, a silicon oxynitride layer, a silicon oxide layer, a titanium oxide layer, an aluminum oxide layer, or the like. The organic layer may include an acrylic-based organic layer. However, embodiments of the present disclosure are not necessarily limited thereto.

The sensor layer ISL may include a base layer 201, a first conductive layer 202, a sensing insulating layer 203, a second conductive layer 204, and a cover insulating layer 205.

In an embodiment, the base layer 201 may be an inorganic layer including at least one of silicon nitride, silicon oxynitride, and silicon oxide. Alternatively, the base layer 201 may be an organic layer including an epoxy resin, at acrylate resin, or an imide-based resin. The base layer 201 may have a single-layer structure or may have a multi-layer structure stacked in the third direction DR3.

Each of the first conductive layer 202 and the second conductive layer 204 may have a single-layer structure or may have a multi-layer structure stacked in the third direction DR3.

A conductive layer of a single-layer structure may include a metal layer or a transparent conductive layer. In an embodiment, the metal layer may include molybdenum, silver, titanium, copper, aluminum, or an alloy thereof. The transparent conductive layer may include transparent conductive oxide, such as indium tin oxide (ITO), indium zinc oxide (IZO), zinc oxide (ZnO), or indium zinc tin oxide (IZTO). In addition, the transparent conductive layer may include conductive polymer such as PEDOT, metal nanowire, graphene, or the like.

A conductive layer of a multi-layer structure may include metal layers. The metal layers may, for example, have a three-layer structure of titanium/aluminum/titanium. The conductive layer of the multi-layer structure may include at least one metal layer and at least one transparent conductive layer.

At least one of the sensing insulating layer 203 and the cover insulating layer 205 may include an inorganic film. In an embodiment, the inorganic film may include at least one compound selected from an aluminum oxide, a titanium oxide, a silicon oxide, a silicon nitride, a silicon oxynitride, a zirconium oxide, and a hafnium oxide.

At least one of the sensing insulating layer 203 and the cover insulating layer 205 may include an organic film. In an embodiment, the organic film may include at least one material selected from acrylate-based resin, methacrylate-based resin, polyisoprene, vinyl-based resin, epoxy-based resin, urethane-based resin, cellulose-based resin, siloxane-based resin, polyimide-based resin, polyamide-based resin, and perylene-based resin.

Figure 4:
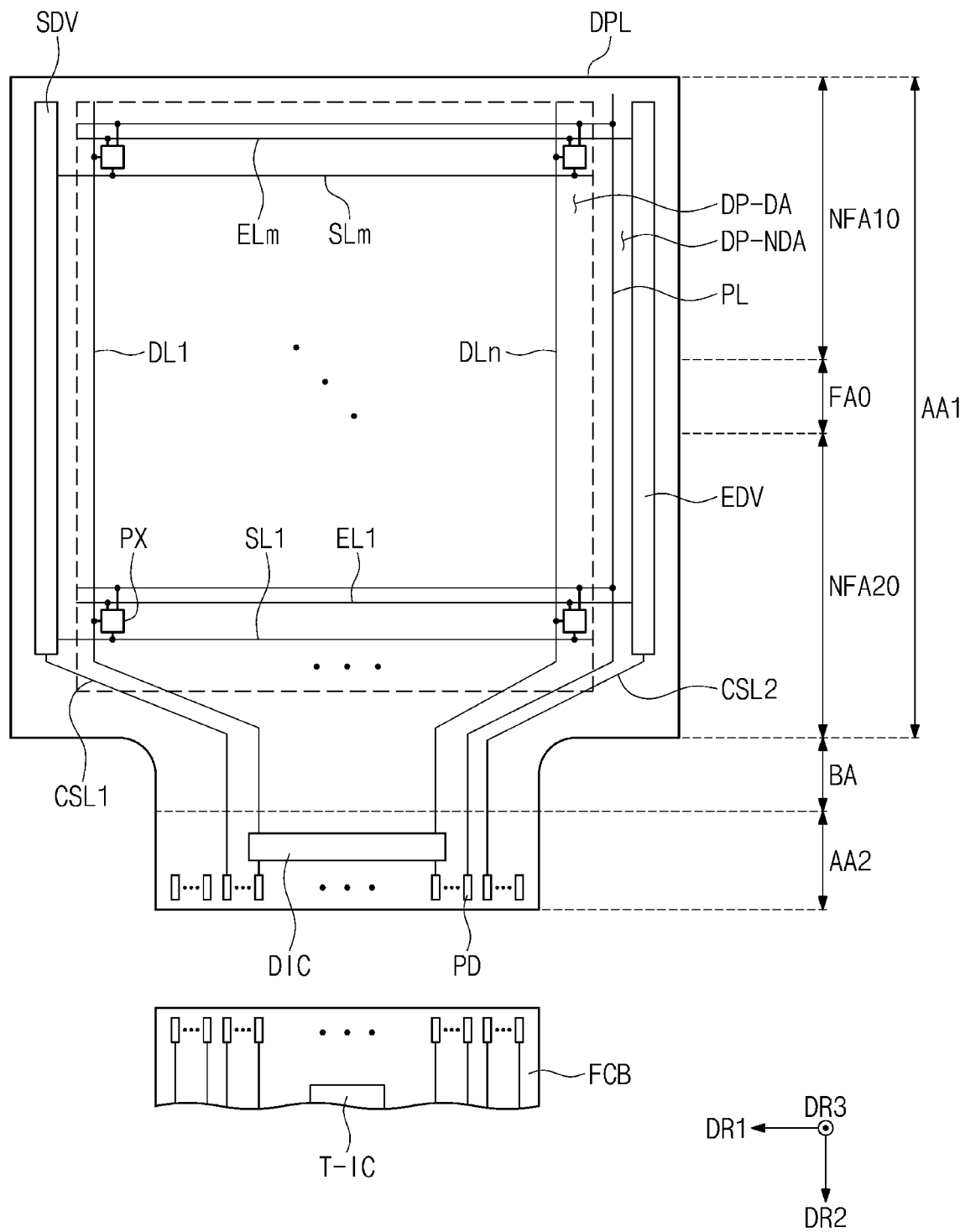
FIG. 4 is a plan view of a display layer according to an embodiment of the present disclosure.

FIG. 4 is a plan view of a display layer according to an embodiment of the present disclosure.

Referring to FIG. 4, the display area DP-DA and the non-display area DP-NDA around the display area DP-DA may be defined in the display layer DPL. The display area DP-DA and the non-display area DP-NDA may be distinguished depending on whether or not a pixel PX is disposed therein. The pixel PX is disposed in the display area DP-DA.

In an embodiment, a scan driver SDV, a data driver, and a light emitting driver EDV may be arranged in the non-display area DP-NDA. The data driver may be a portion of a circuit included in the drive chip DIC.

The display layer DPL may include a first panel area AA1, a bending area BA, and a second panel area AA2 defined in the second direction DR2. The second panel area AA2 and the bending area BA may be partial areas of the non-display area DP-NDA. The bending area BA is disposed between the first panel area AA1 and the second panel area AA2.

The first panel area AA1 is an area corresponding to the display surface DS of FIG. 1A. The first panel area AA1 may include a first non-folding area NFA10, a second non-folding area NFA20, and a folding area FA0. The first non-folding area NFA10, the second non-folding area NFA20, and the folding area FA0 respectively correspond to the first non-folding area NFA1, the second non-folding area NFA2, and the folding area FA in FIGS. 1A and 1B.

In an embodiment, the width of the bending area BA and the width (or length) of the second panel area AA2, which are parallel to the first direction DR1, may be less than the width (or length) of the first panel area AA1 parallel to the first direction DR1. An area having a shorter length in a bending axis direction may be more easily bent.

The display layer DPL may include the plurality of pixels PX, a plurality of scan lines SL1 to SLm, a plurality of data lines DL1 to a plurality of light emitting lines EL1 to ELm, first and second control lines CSL1 and CSL2, a power line PL, and a plurality of pads PD. In this embodiment, "m" and "n" are natural numbers. The pixels PX may be connected to the scan lines SL1 to SLm, the data lines DL1 to DLn, and the light emitting lines EL1 to ELm.

The scan lines SL1 to SLm may extend in the first direction DR1 and be spaced apart from each other in the second direction DR2. The scan lines SL1 to SLm may be electrically connected to the scan driver SDV. The data lines DL1 to DLn may extend in the second direction DR2 and may be spaced apart in the first direction DR1. The data lines DL1 to DLn may be electrically connected to the drive chip DIC via the bending area BA. The light emitting lines EL1 to ELm may extend in the first direction DR1 and may be spaced apart in the second direction DR2. The light emitting lines EL1 to ELm may be electrically connected to the light emitting driver EDV.

The power line PL may include a portion extending in the second direction DR2 and a portion extending in the first direction DR1. The portion extending in the first direction DR1 and the portion extending in the second direction DR2 may be arranged in different layers. The portion, which extends in the second direction DR2, of the power line PL may extend to the second panel area AA2 via the bending area BA. The power line PL may provide a first voltage to the pixels PX.

The first control line CSL1 may be connected to the scan driver SDV and may extend toward a lower end of the second panel area AA2 via the bending area BA. The second control line CSL2 may be connected to the light emitting driver EDV and may extend toward the lower end of the second panel area AA2 via the bending area BA.

When viewed on a plane, the pads PD may be arranged to be adjacent to the lower end (e.g., in the second direction DR2) of the second panel area AA2. The drive chip DIC, the power line PL, the first control line CSL1, and the second control line CSL2 may be electrically connected to the pads PD. In an embodiment, the flexible circuit film FCB may be electrically connected to the pads PD through an anisotropic conductive adhesive layer.

Figure 5A:
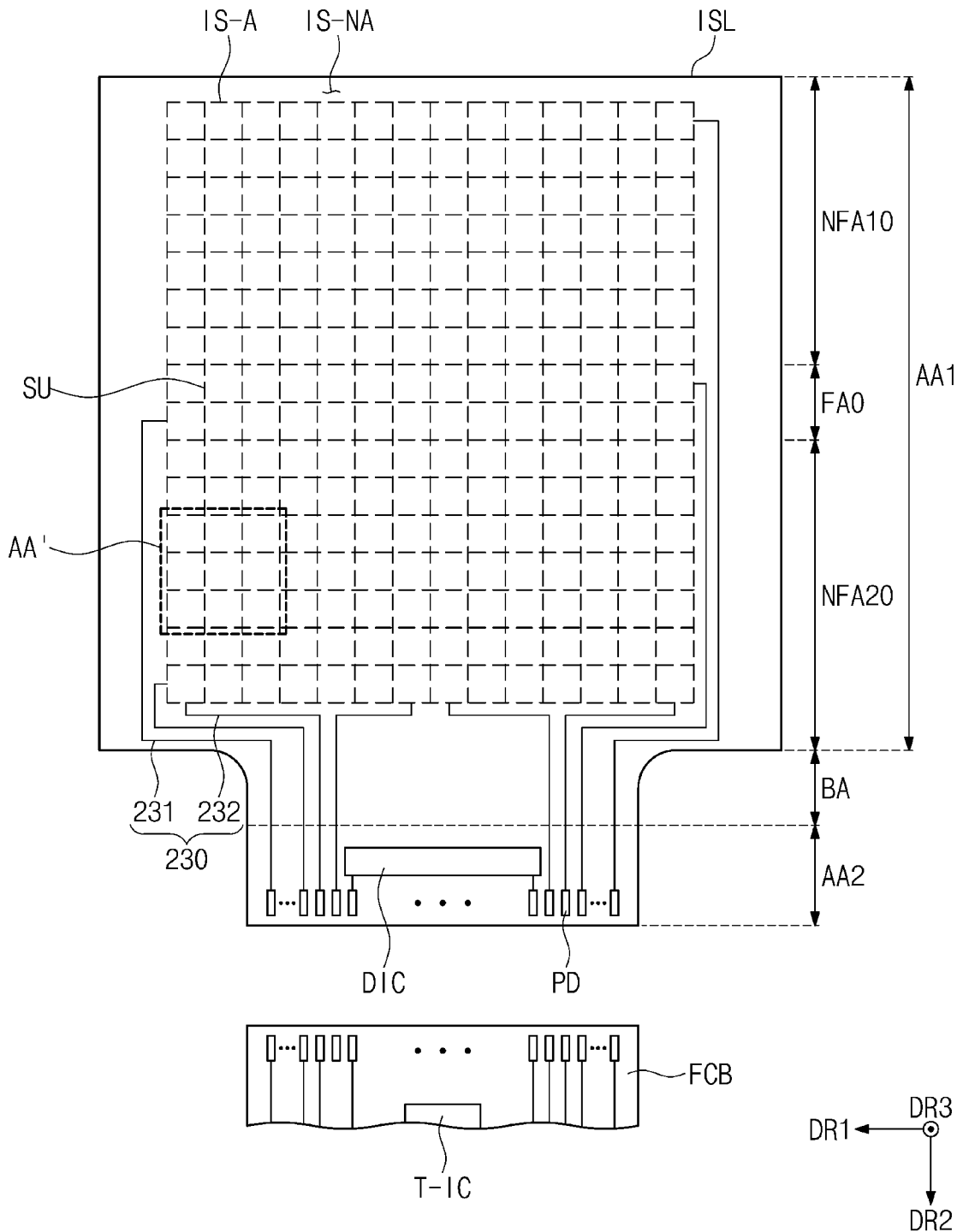
FIG. 5A is a plan view of a sensor layer according to an embodiment of the present disclosure.
Figure 5B:
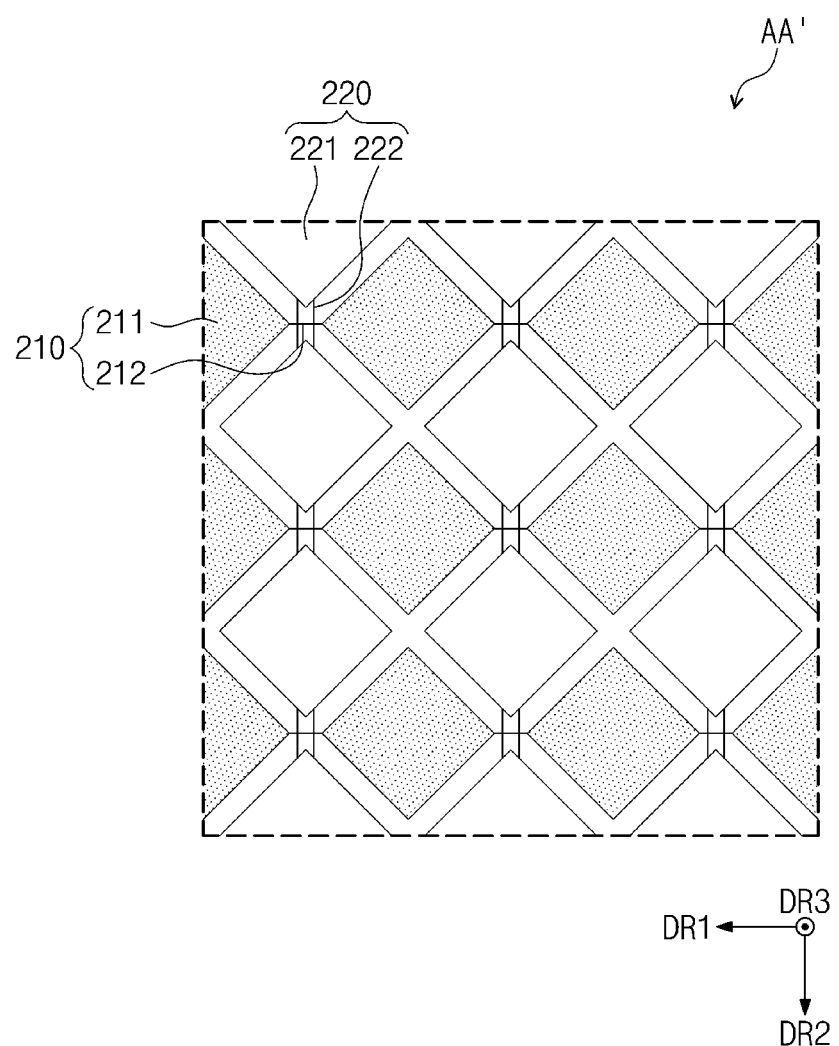
FIG. 5B is an enlarged plan view of an area AA' illustrated in FIG. 5A according to an embodiment of the present disclosure.

FIG. 5A is a plan view of a sensor layer according to an embodiment of the present disclosure. FIG. 5B is an enlarged plan view of an area AA' illustrated in FIG. 5A.

Referring to FIGS. 5A and 5B, a sensing area IS-A and a peripheral area IS-NA may be defined in the sensor layer ISL. The sensing area IS-A may be an area that is activated according to an electric signal. For example, the sensing area IS-A may be an area that senses an external input. The peripheral area IS-NA may be adjacent to the sensing area IS-A and surround the sensing area IS-A. The peripheral area IS-NA may be an area that is not activated according to an electric signal.

The sensor layer ISL may include electrodes 210, cross electrodes 220, and sensing lines 230. The electrodes 210 and the cross electrodes 220 may be arranged in the sensing area IS-A, and the sensing lines 230 may be disposed in the peripheral area IS-NA. In an embodiment, the sensor layer ISL may acquire information on the external input on the basis of a change in a mutual capacitance between the electrodes 210 and the cross electrodes 220.

The sensor layer ISL may include a plurality of sensing units SU. Each of the plurality of sensing units SU may be defined as an area in which one electrode 210 among the electrodes 210 and one cross electrode 220 among the cross electrodes 220 intersect each other.

In an embodiment, the electrodes 210 may each extend in the first direction DR1 and may be arranged in the second direction DR2. The electrodes 210 may each include first portions 211 and a second portion 212. The second portion 212 may be adjacent to the two first portions 211 adjacent to each other (e.g., in the first direction DR1). Each of the electrodes 210 may form a row.

The cross electrodes 220 may be arranged in the first direction DR1 and may each extend in the second direction DR2. The cross electrodes 220 may include patterns 221 and connection patterns 222 (or bridge patterns). Each of the cross electrodes 220 may form a column. The connection patterns 222 may electrically connect the two patterns 221 adjacent to each other (e.g., in the second direction DR2). The two patterns 221 adjacent to each other may be connected to each other by the two connection patterns 222. However, embodiments of the present disclosure are not necessarily limited thereto. For example, in an embodiment, the second portion 212 may cross the two connection patterns 222 and may be insulated therefrom.

In an embodiment, the patterns 221, the first portions 211, and the second portions 212 may be arranged on the same layer as each other, and the connection patterns 222 may be arranged on a different layer from that of the patterns 221, the first portions 211, and the second portions 212. For example, the patterns 221, the first portions 211, and the second portions 212 may be included in the second conductive layer 204 (see FIG. 3B), and the connection patterns 222 may be included in the first conductive layer 202 (see FIG. 3B). The above structure may be referred to as a bottom bridge structure. However, embodiments of the present disclosure are not necessarily limited thereto. For example, in an embodiment the patterns 221, the first portions 211, and the second portions 212 may be included in the first conductive layer 202 (see FIG. 3B), and the connection patterns 222 may be included in the second conductive layer 204 (see FIG. 3B). The above structure may be referred to as a top bridge structure.

The shapes of the electrodes 210 and the cross electrodes 220 and the arrangement relationship between the electrodes 210 and the cross electrodes 220 illustrated in FIG. 5 are merely illustrated as an example. The shapes of the electrodes 210 and the cross electrodes 220 constituting the sensor layer ISL and the arrangement relationship between the electrodes 210 and the cross electrodes 220 may vary and are not necessarily limited to those illustrated in FIG. 5B.

The sensing lines 230 may be electrically connected to corresponding pads among the pads PD. The sensing lines 230 may include lines 231 and cross lines 232.

The lines 231 may be electrically connected to the electrodes 210, respectively. Some of the lines 231 may be connected to left sides of some of the electrodes 210, and the others of the lines 231 may be connected to right sides of the others of the electrodes 210. The cross lines 232 may be electrically connected to the cross electrodes 220, respectively. However, a connection relationship between the lines 231 and the electrodes 210 and a connection relationship between the cross lines 232 and the cross electrodes 220 are not necessarily limited to those illustrated in FIG. 5A.

A sensor driver T-IC may be electrically connected to the sensor layer ISL to provide a driving signal to the sensor layer ESL and may calculate coordinates from an external input. The sensor driver T-IC may be implemented in a chip form and may be mounted on a flexible circuit film FCB (see FIG. 2). The sensor driver T-IC may be electrically connected to the lines 231 and the cross lines 232.

Figure 5C:
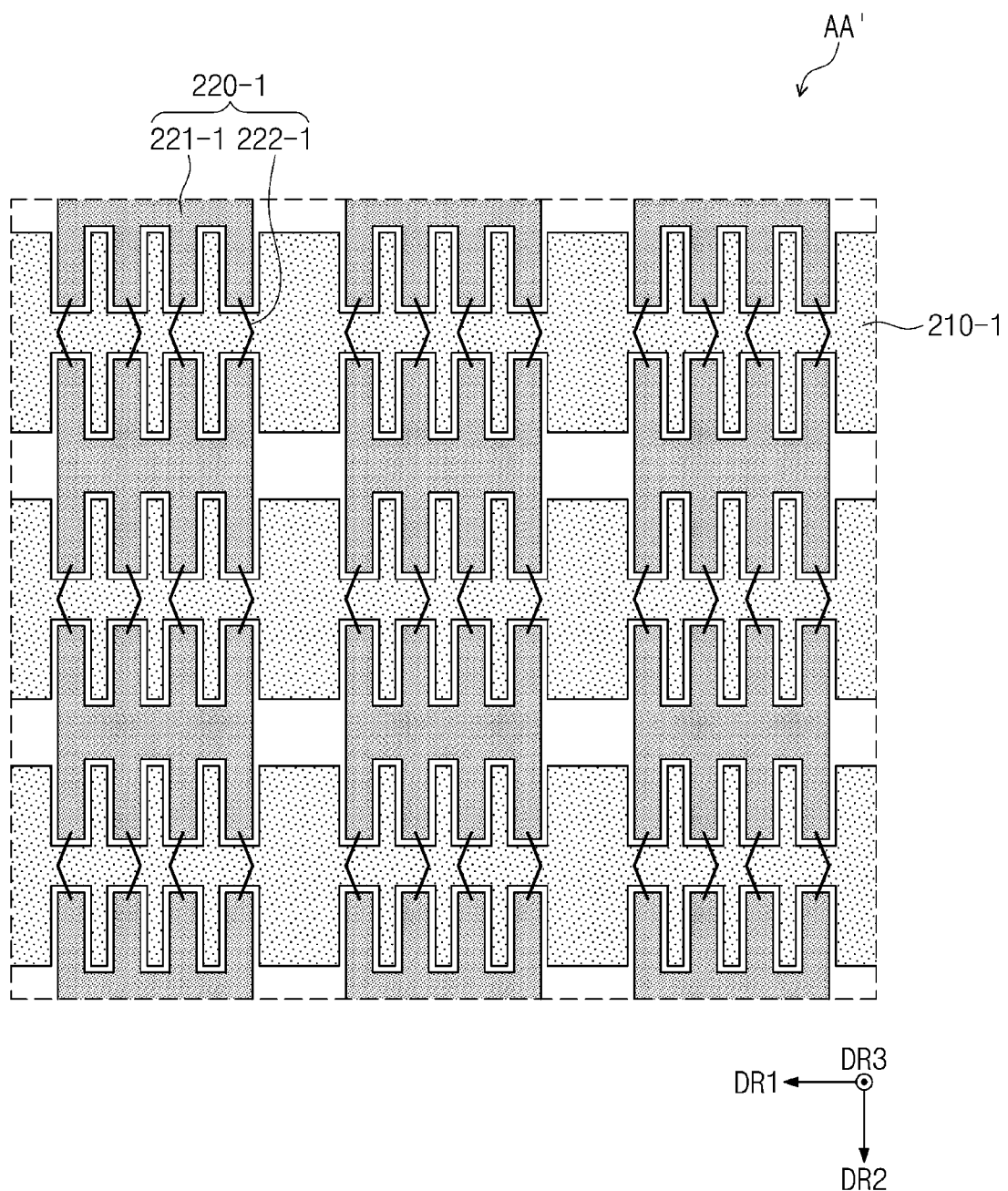
FIG. 5C is an enlarged plan view of an area AA' illustrated in FIG. 5A according to an embodiment of the present disclosure.

FIG. 5C is an enlarged plan view of the area AA' illustrated in FIG. 5A.

FIG. 5C illustrates electrodes 210-1 and cross electrodes 220-1 having different shapes from those illustrated in FIG. 5B. For example, in an embodiment, the electrodes 210-1 and the cross electrodes 220-1 may have a rod shape.

The electrodes 210-1 may extend in the first direction DR1, and the electrodes 210-1 may be arranged in the second direction DR2. The cross electrodes 220-1 may be arranged in the first direction DR1, and the cross electrodes 220-1 may each extend in the second direction DR2. The cross electrodes 220-1 may include patterns 221-1 and connection patterns 222-1 (or bridge patterns). The connection patterns 222-1 may electrically connect the two patterns 221-1 adjacent to each other (e.g., in the second direction DR2). In an embodiment, as shown in FIG. 5C the two patterns 221-1 adjacent to each other may be connected to each other by the four connection patterns 222-1. However, embodiments of the present disclosure are not necessarily limited thereto and the numbers of the connection patterns 222-1 connecting two patterns 221-1 adjacent to each other may vary. One electrode 210-1 may cross the four connection patterns 222-1 and may be insulated therefrom. It has been illustrated that the electrodes 210-1 and the patterns 221-1 have a meshing shape. However, embodiments of the present disclosure are not necessarily limited thereto.

The electrodes 210 or 210-1 and the cross electrodes 220 or 220-1 described with reference to embodiments shown in FIGS. 5B and 5C may each have a mesh structure. in this embodiment, an opening may be defined in each of the electrodes 210 or 210-1 and the cross electrodes 220 or 220-1. However, embodiments of the present disclosure are not necessarily limited thereto, and the electrodes 210 or 210-1 and the cross electrodes 220 or 220-1 may be a transparent electrode in which the opening is not defined.

Figure 6:
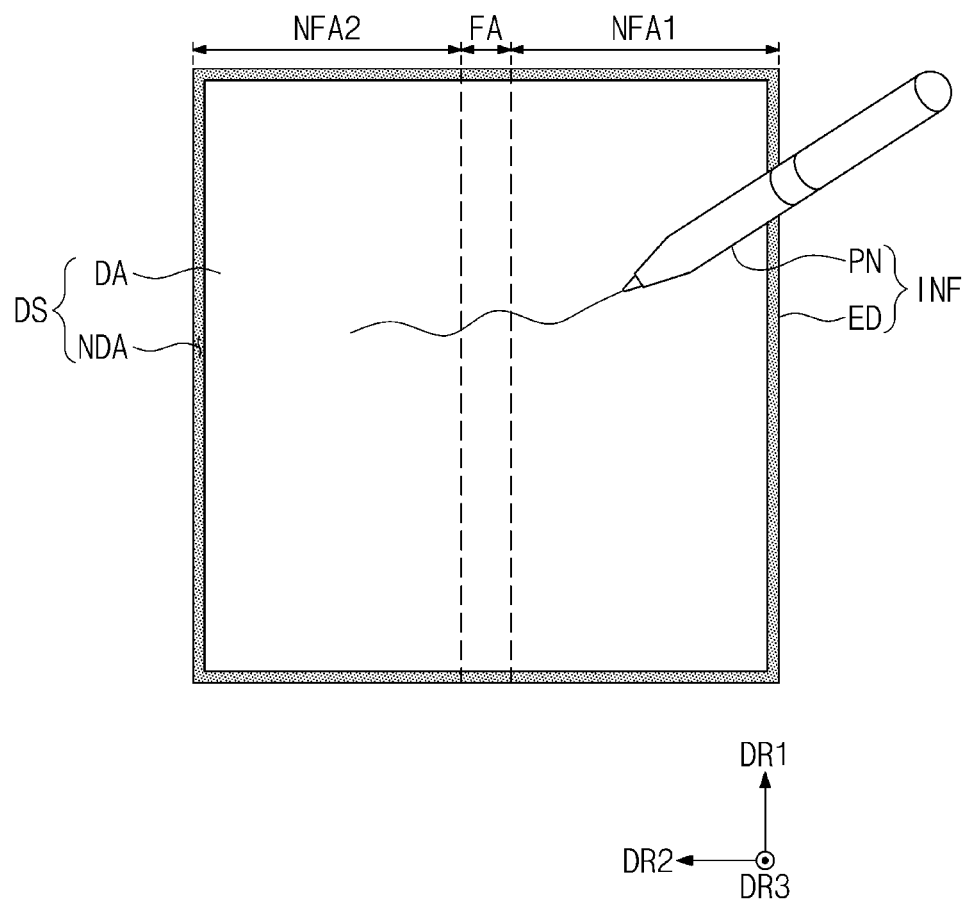
FIG. 6 is a plan view illustrating an interface device according to a embodiment of the present disclosure.
Figure 7:
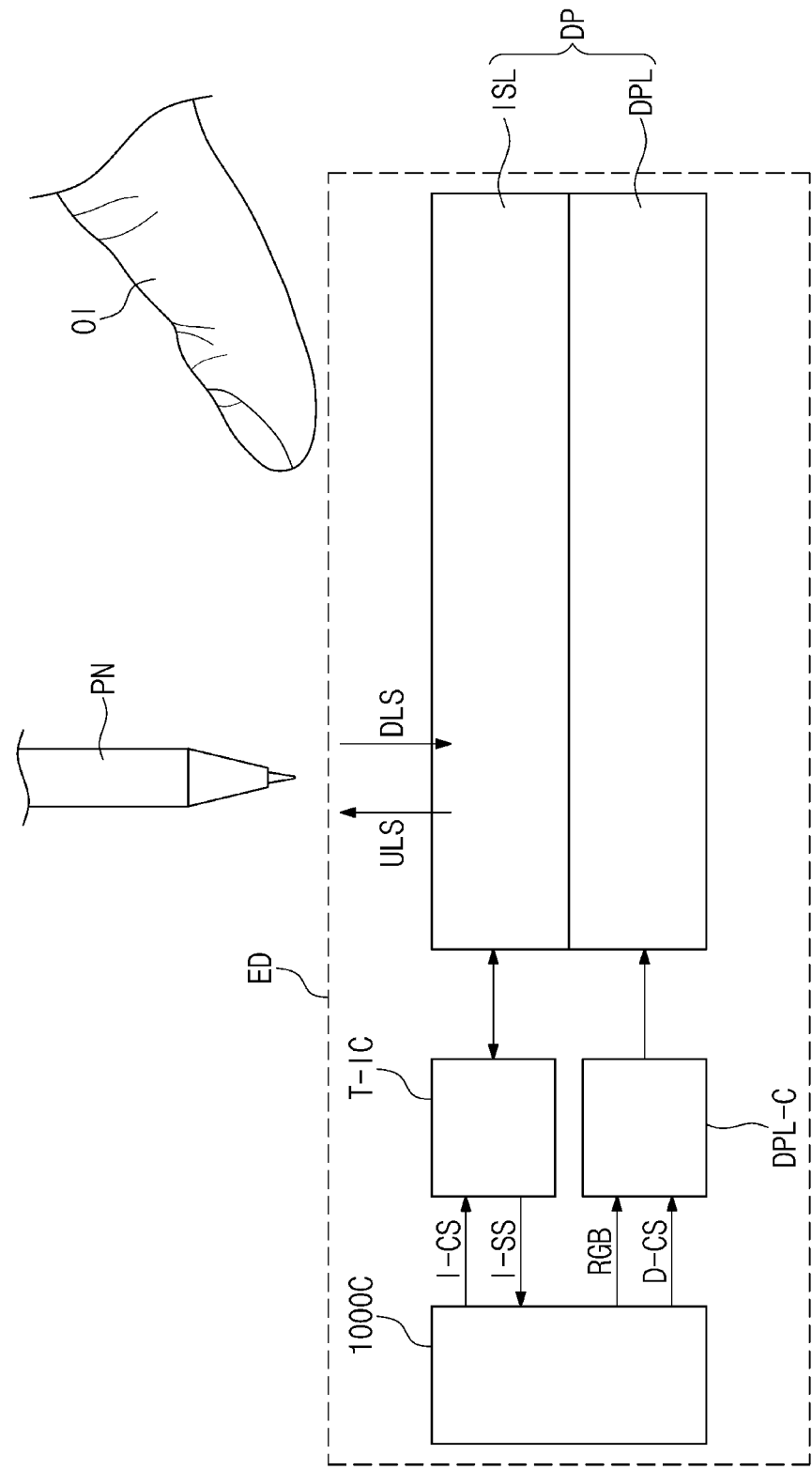
FIG. 7 is a schematic view for describing an operation between the electronic device and an input device according to an embodiment of the present disclosure.

FIG. 6 is a plan view illustrating an interface device according to an embodiment of the present disclosure. FIG. 7 is a schematic view for describing an operation between the electronic device and an input device according to an embodiment of the present disclosure.

Referring to FIGS. 6 and 7, an interface device INF may include the electronic device ED and an input device PN.

The interface device INF may be referred to as an electronic system, a touch system, an input/output system, a pen tablet, or a pen terminal.

The electronic device ED may sense inputs applied from an external unit. For example, the electronic device ED may sense both an active input by the input device PN and a second passive input by a touch OI. The input device PN is an active type input unit that provides a driving signal, and may be, for example, an active pen. The touch OI may include all input units capable of providing a change in a capacitance, such as a users body and a passive pen.

In an embodiment, the electronic device ED and the input device PN may bi-directionally communicate with each other. The electronic device ED may provide an uplink signal ULS to the input device PN, and the input device PN may provide a downlink signal DLS to the electronic device ED. For example, in an embodiment, the uplink signal ULS may include information such as panel information and a protocol version. However, embodiments of the present disclosure are not necessarily limited thereto. In an embodiment, the downlink signal DLS may include a synchronization signal or information on the state of the input device PN. For example, the downlink signal DLS may include coordinate information of the input device PN, battery information of the input device PN, inclination information of the input device PN and/or various pieces of information stored in the input device PN. However, embodiments of the present disclosure are not necessarily limited thereto.

The electronic device ED may include the display panel DP, a display driver DPL-C, the sensor driver T-IC, and a main driver 1000C.

The main driver 1000C may control the overall operation of the electronic device ED. For example, the main driver 1000C may control operations of the display driver DPL-C and the sensor driver T-IC. The main driver 1000C may include at least one microprocessor, and the main driver 1000C may be referred to as a "host". The main driver 1000C may further include a graphic controller.

The display driver DPL-C may drive the display layer DPL. In an embodiment, the display driver DPL-C may include the drive chip DIC, the scan driver SDV, and the light emitting driver EDV, which are shown in FIG. 4. The display driver DPL-C may receive image data RGB and a control signal D-CS from the main driver 1000C. The control signal D-CS may include various signals. For example, the control signal D-CS may include an input vertical synchronization signal, an input horizontal synchronization signal, a main dock, a data enable signal, and the like. The display driver DPL-C may generate a vertical synchronization signal and a horizontal synchronization signal for controlling a timing of providing a signal to the display layer DPL on the basis of the control signal D-CS.

The sensor driver T-IC may drive the sensor layer ISL. The sensor driver T-IC may receive a control signal I-CS from the main driver 1000C. The control signal I-CS may include a mode determination signal and a clock signal for determining a drive mode of the sensor driver T-IC. The sensor driver T-IC may be operated, on the basis of the control signal I-CS, in a first mode in which input by the touch OI is sensed or a second mode in which input by the input device PN is sensed.

The sensor driver T-IC may calculate coordinate information of the first input or the second input on the basis of a signal received from the sensor layer ISL and provide a coordinate signal I-SS having the coordinate information to the main driver 1000C. The main driver 1000C executes an operation corresponding to the users input on the basis of the coordinate signal I-SS. For example, in an embodiment, the main driver 1000C may operate the display driver DPL-C so that a new application image is displayed on the display layer DPL on the basis of the coordinate signal I-SS.

Figure 8A:
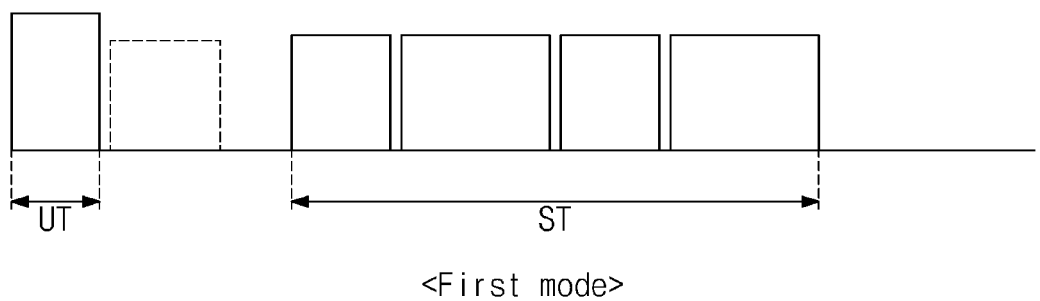
FIG. 8A is a schematic view illustrating an operation of a first mode according to an embodiment of the present disclosure.
Figure 8B:
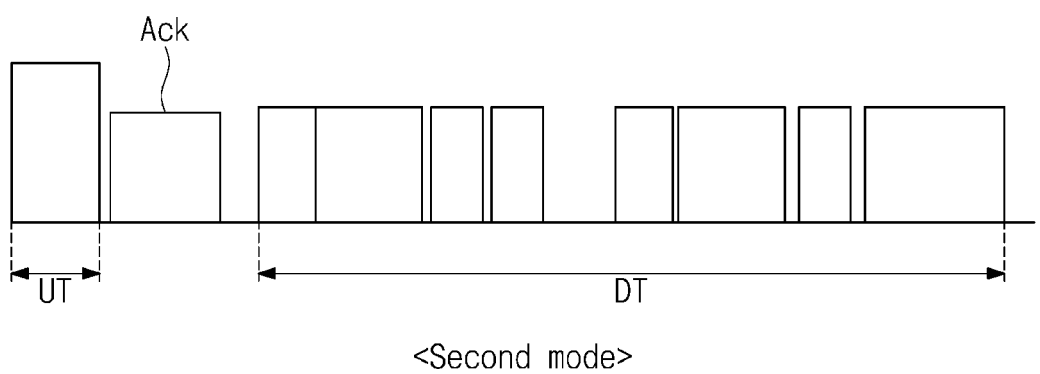
FIG. 8B is a schematic view illustrating an operation of a second mode according to an embodiment of the present disclosure.

FIG. 8A is a schematic view illustrating an operation of a first mode according to an embodiment of the present disclosure. FIG. 8B is a schematic view illustrating an operation of a second mode according to an embodiment of the present disclosure. For example, FIGS. 8A and 8B are views illustrating operation at a report rate of one period.

Referring to FIGS. 5A, 5B, 7, and 8A, in the first mode, the sensor driver T-IC may sense a passive input through a change in a mutual capacitance formed between the plurality of electrodes 210 and the plurality of cross electrodes 220. However, embodiments of the present disclosure are not necessarily limited thereto. For example, in the first mode, the sensor driver T-IC may sense the passive input through a change in a self-capacitance of each of the plurality of electrodes 210 and the plurality of cross electrodes 220. The first mode may be referred to as a finger touch sensing mode.

Even in the first mode, be sensor driver T-IC needs to continuously monitor whether or not the input device PN (see FIG. 7) approaches. Thus, the sensor driver T-IC may periodically transmit the uplink signal ULS, for example, a beacon signal, through the sensor layer ISL. For example, the sensor layer ISL may transmit the uplink signal ULS during a period of time referred to as an uplink section UT. Thereafter, if a response signal is not received from the input device PN, the sensor layer ISL may sense the passive input during a period of time referred to as a sensing section ST. When a response signal ACK (see FIG. 8B) is received, the sensor layer ISL may be switched to the second mode and operated.

Referring to FIGS. 5A, 5B, 7, and 8B, in the second mode, the sensor driver T-IC may sense an active input through a change in a capacitance of at least one of the plurality of electrodes 210 and the plurality of cross electrodes 220. In the uplink section UT, the uplink signal ULS is provided, and when the response signal ACK is received from the input device PN, the sensor layer ISL may enter a period of time referred to as the downlink section DT. In an embodiment, in the downlink section DT, the sensor layer ISL may receive location information, data having information on a button state, tilt information, and the like from the input device PN.

As illustrated in FIGS. 8A and 8B, as the uplink signal ULS is provided to the uplink section UT, a signal provided to the data lines DL1 to DLn (see FIG. 4) and the uplink signal ULS collide with each other, and thus flicker may occur. According to an embodiment of the present disclosure, in the uplink section UT, the uplink signal ULS may be provided to a first portion of the sensing area IS-A, and an inverse phase signal ULSR (see FIG. 10) having an inverse phase of the uplink signal ULS may be provided to a second portion spaced apart from the first portion of the sensing area IS-A. In this embodiment, an influence occurring on the signal provided to the data lines DL1 to DLn (see FIG. 4) may be reduced or prevented. Thus, a flicker phenomenon caused by the uplink signal ULS may be reduced or prevented by the inverse phase signal ULSR, and thus the image quality of an image displayed on the display layer DPL may be increased. For example, the image quality of the electronic device ED may be increased.

Figure 9A:
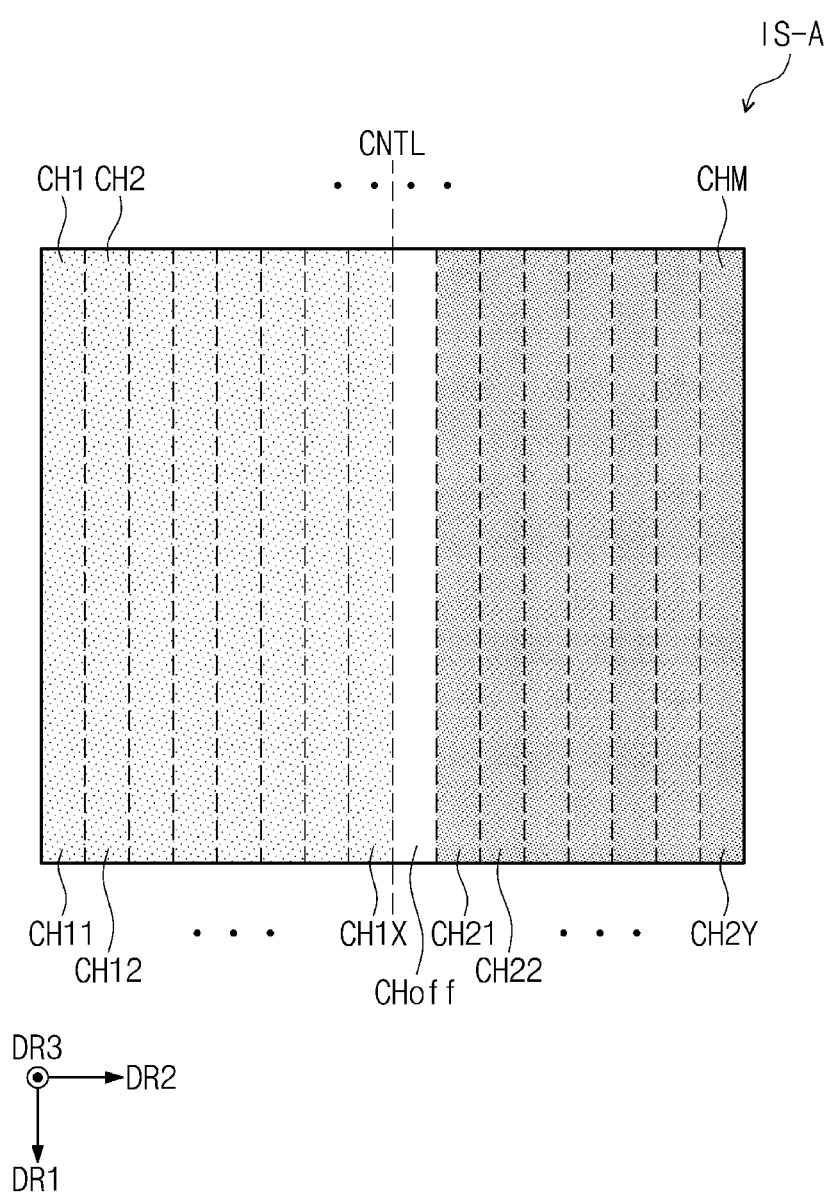
FIG. 9A is a schematic view illustrating a plurality of channels according to an embodiment of the present disclosure.
Figure 9B:
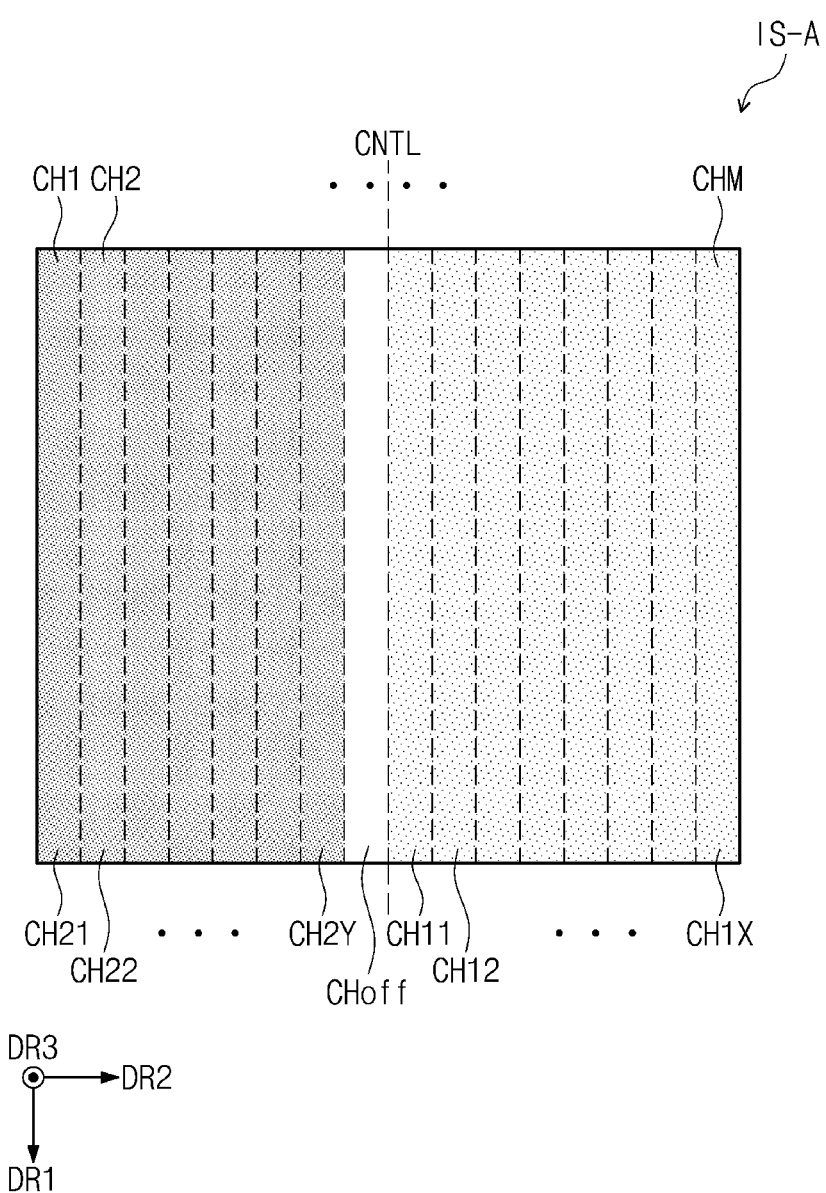
FIG. 9B is a schematic view illustrating the plurality of channels according to an embodiment of the present disclosure.
Figure 10:
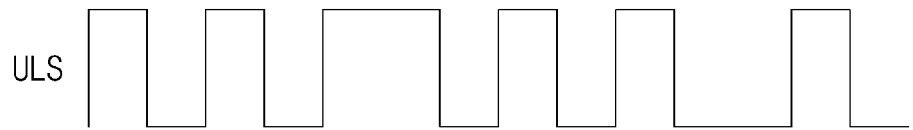
FIG. 10 is a schematic view illustrating signals provided in an uplink section according to an embodiment of the present disclosure.
Figure 10:
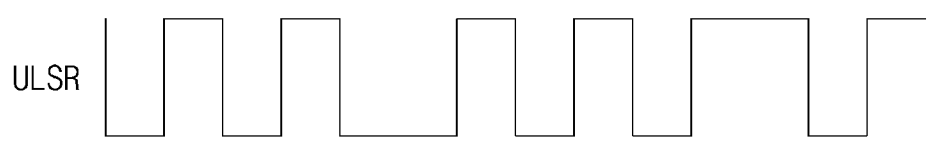

FIG. 9A is a schematic view illustrating a plurality of channels according to an embodiment of the present disclosure. FIG. 9B is a schematic view illustrating the plurality of channels according to an embodiment of the present disclosure. FIG. 10 is a schematic view illustrating signals provided to an uplink section according to an embodiment of the present disclosure.

Referring to FIGS. 9A and 9B, a plurality of channels CH1, CH2 to CHM arranged in the sensing area IS-A are illustrated. The plurality of channels CH1, CH2 to CHM may each extend in the first direction DR1 and may be arranged in the second direction DR2. In an embodiment, the plurality of channels CH1, CH2 to CHM may correspond to the plurality of electrodes 210 illustrated in FIG. 5A, respectively. For example, each channel of the plurality of channels CH1, CH2 to CHM may respectively correspond to one row of the electrodes. However, embodiments of the present disclosure are not necessarily limited thereto. For example, in an embodiment the plurality of channels CH1, CH2 to CHM may correspond to the plurality of cross electrodes 220 illustrated in FIG. 5A, respectively. For example, each channel of the plurality of channels CH1, CH12 to CHM may respectively correspond to one column of the cross electrodes 220. In a embodiment, "M" may be an integer greater than or equal to 5. It is illustrated in FIGS. 9A and 9B that the lumber of the plurality of channels CH1, CH2 to CHM is 16 as an example. However, embodiments of the present disclosure are not necessarily limited thereto. For example, in an embodiment, the number of the plurality of channels CH1, CH2 to CHM may be in a range of about 40 to about 70.

Referring to FIGS. 9A and 10, in a first uplink section, the uplink signal ULS may be provided to "X" continuously arranged first channels CH11, CH12 to CH1X among the plurality of channels CH1, CH2 to CHM. For example, the X first channels CH11, CH12 to CH1X that are continuously arranged may be adjacent rows of electrodes 210 (e.g., in the second direction DR2) or adjacent rows of cross electrodes 220 (e.g., in the first direction DR1). In an embodiment, "X" may be an integer greater than or equal to 2. The inverse phase signal ULSR having an inverse phase of the uplink signal ULS may be provided to "Y" continuously arranged second channels CH21, CH22 to CH2Y among the plurality of channels CH1, CH2 to CHMa. "Y" may be an integer greater than or equal to 2. "Z" off channels CHoff between the first channels CH11, CH12 to CH1X and the second channels CH21, CH22 to CH2Y among the plurality of channels CH1, CH2 to CHM may be turned off. In an embodiment, "Z" may be an integer greater than or equal to 1. Both the uplink signal ULS and the inverse phase signal ULSR may not be provided to the off channel CHoff which may be referred to as the channel being "turned off". "M" may be the sum of "X", "Y", "Z".

In an embodiment, the number of the first channels CH11, CH12 to CH1X may be greater than the number of the second channels CH21, CH22 to CH2Y. For example, in an embodiment "X" may be at least half of "M", and "Y" may be less than the half of "M". In an embodiment in which the number of the "M" channels is 2n (n is a positive integer), the number of the "X" first channels CH11, CH12 to CH1X may be n.

In an embodiment, the "X" first channels CH11, CH12 to CH1X may overlap at least a half of the area of the sensing area IS-A. The "Z" off channels CHoff and the "Y" second channels CH21, CH22 to CH2Y may overlap no more than half of the area of the sensing area IS-A. For example, as shown in FIG. 9A, the "X" first channels CH11, CH12 to CH1X may overlap half of the area of the sensing area IS-A. The "Z" off channels CHoff and the "Y" second channels CH21, CH22 to CH2Y may together overlap half of the area of the sensing area IS-A. Referring to an embodiment of FIG. 9A, a central line CNTL passing through the center (e.g., in the second direction Dr2) of the sensing area IS-A is illustrated. In the first uplink section, the first channels CH11, CH12 to CH1X may be arranged on a left side of the central line CNTL (e.g., in the second direction DR2), and the off channel CHoff and the second channels CH21, CH22 to CH2Y may be arranged on a right side of the central line CNTL (e.g., in the second direction DR2).

FIG. 9B illustrates an operation in a second uplink section subsequent to the first uplink section. For example, FIG. 9A is a schematic view illustrating a signal provided to the first uplink section at a report rate of a first period, and FIG. 9B is a schematic view illustrating a signal provided to the second uplink section at a report rate of a second period subsequent to the first period.

Referring to FIG. 9B, in the second uplink section compared to the first uplink section, the locations of the first channels CH11, CH12 to CH1X to which the uplink signal ULS is provided may be changed and the locations of the second channels CH21, CH22 to CH2Y to which the inverse phase of the uplink signal ULS is provided may be changed. For example, in the first uplink section, the plurality of channels CH1, CH2 to CHM may be sequentially defined as the first channels CH11, CH12 to CH1X, the off channel CHoff, and the second channels CH21, CH22, to CH2Y in the second direction DR2. In contrast, in the second uplink section, the plurality of channels CH1, CH2 to CHM may be sequentially defined as the second channels CH21, CH22 to CH2Y, the off channel CHoff, and the first channels CH11, CH12 to CH1X in the second direction DR2.

The location of a first off channel operating as the off channel CHoff among the plurality of channels CH1, CH2 to CHM in the first uplink section may be different from the location of a second off channel operating as the off channel CHoff among the plurality of channels CH1, CH2 to CHM in the second uplink section. For example, in the first uplink section, the off channel CHoff may be disposed on the right side (e.g., in the second direction DR2) of the central line CNTL, and in the second uplink section, the off channel CHoff may be disposed on the left side (e.g., in the second direction DR2) of the central line CNTL.

In the first uplink section. the input device PN (see FIG. 7) may transmit a response signal in response to the uplink signal ULS provided from the first channels CH11, CH12 to CH1X defined on the left side of the central line CNTL. In the second uplink section, the input device PN (see FIG. 7) may transmit the response signal in response to the uplink signal ULS provided from the first channels CH11, CH12 to CH1X defined on the right side of the central line CNTL.

According to an embodiment of the present disclosure, in one uplink section, the uplink signal ULS may be provided to the first portion of the sensing area IS-A, and the inverse phase signal ULSR having an inverse phase of the uplink signal ULS may be provided to the second portion spaced apart from the first portion of the sensing area IS-A. In this embodiment, the flicker phenomenon caused by the uplink signal ULS may be reduced or removed by the inverse phase signal ULSR, and thus the image quality of an image displayed on the display layer DPL may be increased. For example, the image quality of the electronic device ED may be increased.

Further, according to an embodiment of the present disclosure, the second channels CH21, CH22 to CH2Y to which the inverse phase signal ULSR having an inverse phase of the uplink signal ULS is provided may be spaced apart from the first channels CH11, CH12 to CH1X with the off channel CHoff interposed therebetween. Thus, the possibility that the inverse phase signal ULSR affects the driving of the uplink signal ULS provided through the first channels CH11, CH12 to CH1X may be removed or reduced, and an effective area to which the uplink signal ULS is provided may not be reduced. Thus, when at least two periods are repeated, the uplink signal ULS may be provided to the entire sensing area IS-A, and a dead zone to which the uplink signal ULS is not provided may not be generated. As a result, the sensing sensitivity of the sensor layer ISL, for example, the sensing sensitivity of the input device PN (see FIG. 7) may be increased.

Figure 11A:
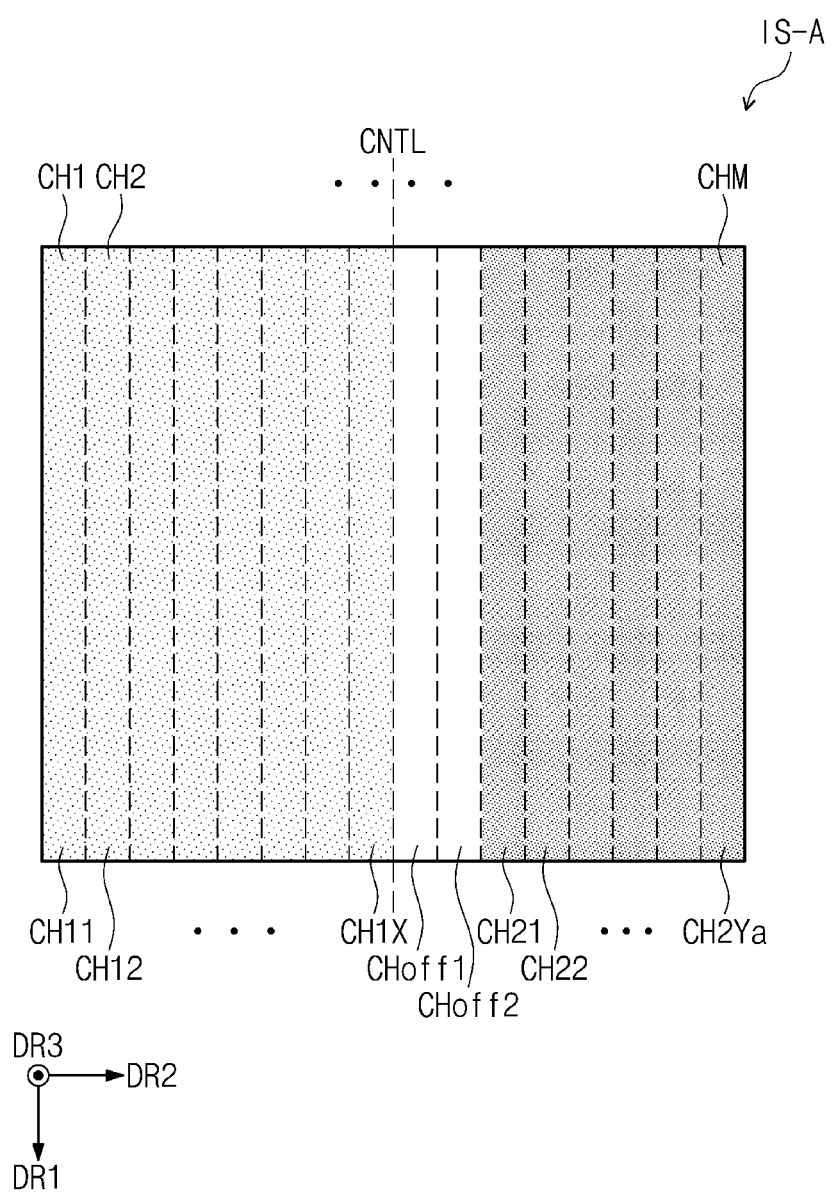
FIG. 11A is a schematic view illustrating the plurality of channels according to an embodiment of the present disclosure.
Figure 11B:
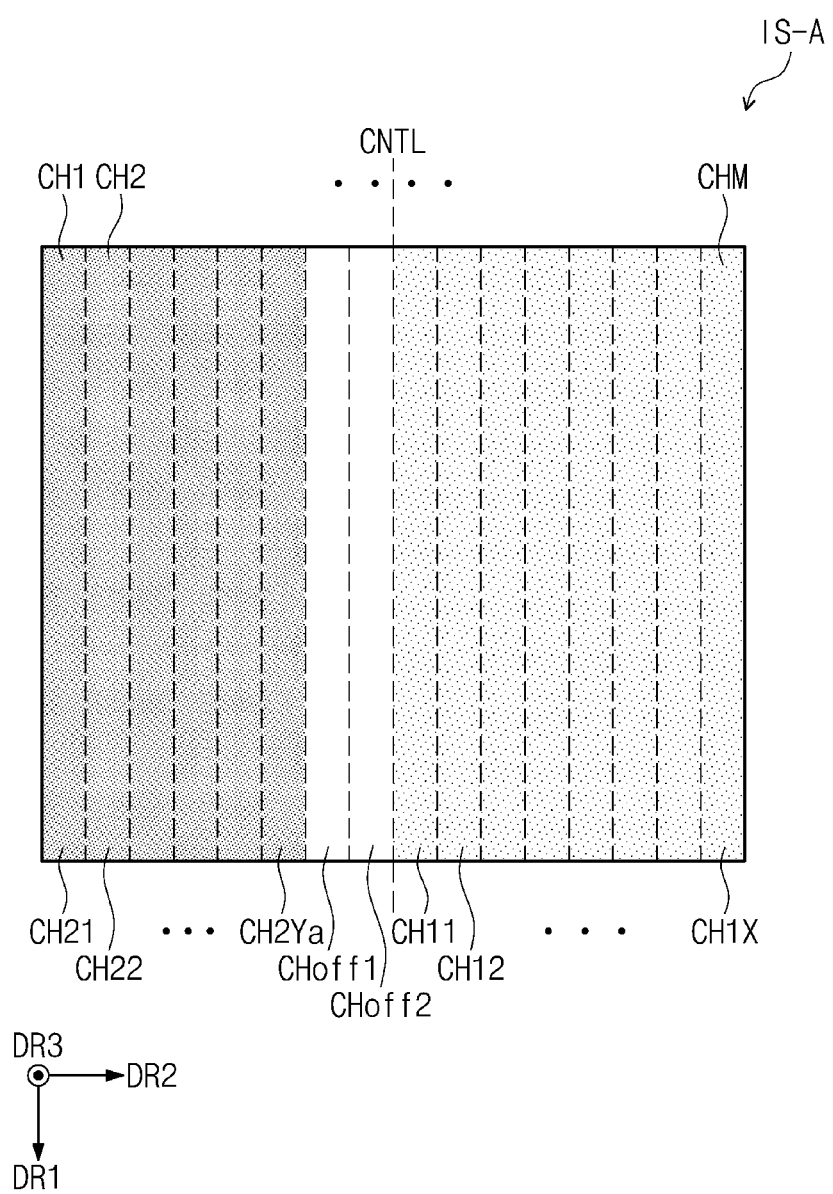
FIG. 11B is a schematic view illustrating the plurality of channels according to an embodiment of the present disclosure.

FIG. 11A is a schematic view illustrating the plurality of channels according to an embodiment of the present disclosure. FIG. 11B is a schematic view illustrating the plurality of channels according to an embodiment of the present disclosure.

Referring to FIG. 11A, in the first uplink section, the uplink signal ULS may be provided to the "X" continuously arranged first channels CH11, CH12 to CH1X among the plurality of channels CH1, CH2 to CHM. In an embodiment, "X" may be an integer greater than or equal to 2. The inverse phase signal having an inverse phase of the uplink signal may be provided to "Ya" continuously arranged second channels CH21, CH22 to CH2Ya among the plurality of channels CH1 to CHM. In an embodiment, Ya may be an integer greater than or equal to 2.

"Z" off channels CHoff1 and CHoff2 between the first channels CH11, CH12 to CH1X and the second channels CH21, CH22 to CH2Ya among the plurality of channels CH1, CH2 to CHM may be turned off. As shown in FIG. 11A, in an embodiment "Z" may be two. Both the uplink signal ULS and the inverse phase signal ULSR may not be provided to the off channels CHoff1 and CHoff2. "M" may be the sum of X, Ya, and Z.

Referring to FIG. 11B, in the second uplink section compared to the first uplink section the locations of the first channels CH11, CH12 to CH1X to which the uplink signal ULS is provided may be changed. For example, in the first uplink section, the plurality of channels CH1, CH2 to CHM may be sequentially defined as the first channels CH11, CH12 to CH1X, the off channels CHoff1 and CHoff2, and the second channels CH21, CH22 to CH2Ya in the second direction DR2. In the second uplink section, the plurality of channels CH1, CH2 to CHM may be sequentially defined as the second channels CH21, CH22 to CH2Ya, the off channels CHoff1 and CHoff2, and the first channels CH11, CH12 to CH1X in the second direction DR2.

In an embodiment in which the size of the sensing area IS-A increases, the intensities of the uplink signal ULS and the inverse phase signal USSR may increase. In this embodiment, to remove or reduce the possibility that the inverse phase signal ULSR affects the driving of the uplink signal ULS provided through the first channels CH11, CH12 to CH1X, the number of the off channels CHoff1 and CHoff2 may be adjusted. For example, the number of the off channels CHoff1 and CHoff2 may increase in response to the inverse phase signal ULSR having an increased intensity.

Figure 12A:
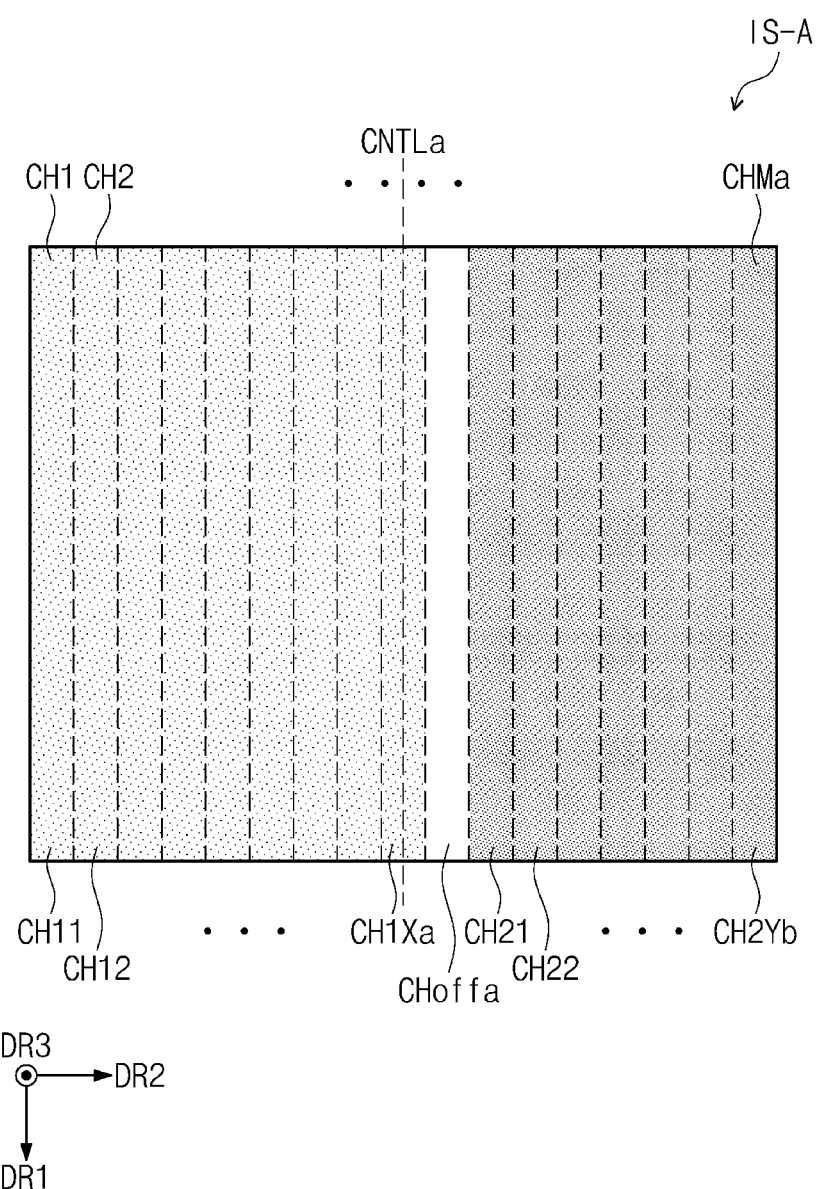
FIG. 12A is a schematic view illustrating the plurality of channels according to an embodiment of the present disclosure.
Figure 12B:
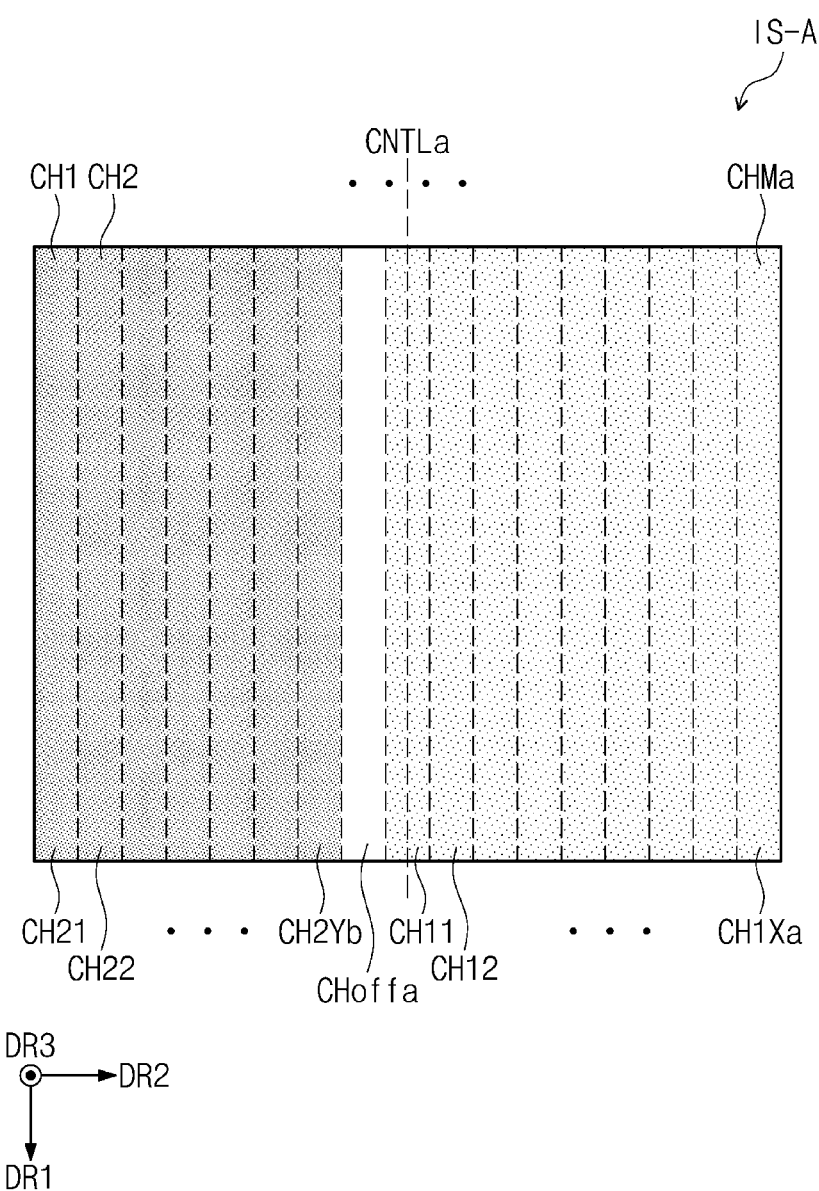
FIG. 12B is a schematic view illustrating the plurality of channels according to an embodiment of the present disclosure.

FIG. 12A is a schematic view illustrating the plurality of channels according to an embodiment of the present disclosure. FIG. 12B is a schematic view illustrating the plurality of channels according to an embodiment of the present disclosure.

Referring to FIGS. 12A and 12B, a plurality of channels CH1, CH2 to CHMa arranged in the sensing area IS-A are illustrated. In an embodiment, Ma may be an integer greater than or equal to 5.

Referring to FIGS. 10 and 12A, in the first uplink section, the uplink signal ULS may be provided to Xa continuously arranged first channels CH11, CH12 to CH1Xa among the plurality of channels CH1, CH2 to CHMa. In an embodiment, Xa may be an integer greater than or equal to 2. The inverse phase signal ULSR having an inverse phase of the uplink signal ULS may be provided to Yb continuously arranged second channels CH21, CH22 to CH2Yb among the plurality of channels CH1, CH2 to CHM. In an embodiment, Yb may be an integer greater than or equal to 2. "Z" off channels CHoffa between the first channels CH11, CH12 to CH1Xa and the second channels CH21, CH22 to CH2Yb an the plurality of channels CH1, CH2 to CHMa may be turned off. In an embodiment, "Z" may be an integer greater than or equal to 1. Both the uplink signal ULS and the inverse phase signal ULSR may not be provided to the off channel CHoffa. Ma may be the sum of Xa, Yb, and "Z".

In an embodiment in which the number of the plurality of Ma channels CH1, CH2 to CHMa is 2n+1 (n is a positive integer), the number of the Xa first channels CH11, CH12 to CH1Xa may be n+1. The Xa first channels CH11, CH12 to CH1Xa may overlap more than the half of the area of the sensing area IS-A. The "Z" off channels CHoffa and the Yb second channels CH21, CH22 to CH2Yb may overlap less than the half of the area of the sensing area IS-A.

Referring to FIG. 12A, a central line CNTLa passing through the center of the sensing area IS-A (e.g., in the second direction DR2) is illustrated. The central line CNTLa may overlap a central channel disposed at a center among the plurality of channels CH1, CH2 to CHMa.

Referring to FIGS. 10 and 12B, an operation in the second uplink section subsequent to the first uplink section is illustrated. In the second uplink section compared to the first uplink section, the locations of the first channels CH11, CH12 to CH1Xa to which the uplink signal ULS is provided may be changed and the locations of the second channels CH21, CH22 to CH2Yb to which the inverse phase of the uplink signal ULS is provided may be changed. For example, in the first uplink section, the plurality of channels CH1, CH2 to CHMa may be sequentially defined as the first channels CH11, CH12 to CH1xa, the off channel CHoffa, and the second channels CH21, CH22 to CH2Yb. In the second uplink section, the plurality of channels CH1, CH2 to CHMa may be sequentially defined as the second channels CH21, CH22 to CH2Yb, the off channel CHoffa, and the first channels CH11, CH12 to CH1Xa.

According to an embodiment of the present disclosure, in each of the first uplink section and the second uplink section, the central channel may be included in the Xa first channels CH11, CH12 to CH1Xa. For example, in an embodiment in which the number of the plurality of channels CH1, CH2 to CHMa is odd, the uplink signal ULS may be continuously provided to the central channel disposed at the center among the plurality of channels CH1, CH2 to CHMa. Thus, when at least two periods are repeated, the uplink signal ULS may be provided to the entire sensing area IS-A, and a dead zone to which the uplink signal ULS is not provided may not be generated.

As described above, in one uplink section, an uplink signal may be provided to a first portion of a sensing area, and an inverse phase signal having an inverse phase of the uplink signal may be provided to a second portion spaced apart from the first portion of the sensing area. In this embodiment, a flicker phenomenon caused by the uplink signal may be reduced or removed by the inverse phase signal and thus the image quality of an image displayed on a display layer may be increased. For example, the image quality of an electronic device may be increased.

Further, second channels to which the inverse phase signal having an inverse phase of the uplink signal is provided may be spaced apart from first channels to which the uplink signal is provided with off channels interposed therebetween. Thus, the possibility that the inverse phase signal affects driving of the uplinks signal provided through the first channels may be removed or reduced, and an effective area to which the uplink signal is provided may not be reduced. Thus, when at least two periods are repeated, the uplink signal may be provided to the entire sensing area, and a dead zone to which the uplink signal is neat provided may not be generated. As a result, sensing sensitivity of a sensor layer may be increased.

Although the description has been made above with reference to non-limiting embodiments of the present disclosure, it may be understood that those skilled in the art or those having ordinary knowledge in the art may variously modify and change the present disclosure without departing from the spirit and technical scope of the present disclosure. Accordingly, the scope of the present disclosure is not limited to the detailed description of embodiments thereof.

What is claimed is:

1. An electronic device comprising:
a display layer that displays an image;
a sensor layer disposed on the display layer and sensing an external input, the sensor layer including a plurality of channels equal to M, wherein M is an integer greater than or equal to 5; and
a sensor driver that drives the sensor layer,
wherein in an uplink section prior to determining that an input device is present,
the sensor driver provides an uplink signal to a group of X first channels that are continuously arranged and directly border each other, wherein X is an integer greater than or equal to 2,
the sensor driver provides an inverse phase signal having an inverse phase of the uplink signal to a group of Y second channels that are continuously arranged and directly border each other, wherein Y is an integer greater than or equal to 2, and
Z off channels that are sequentially arranged among the plurality of channels and directly border each other and are positioned to directly border the group of X first channels and directly border the group of Y second channels, and are turned off, wherein Z is an integer greater than or equal to 1, and wherein M is a sum of X, Y, and Z.

2. The electronic device of claim 1, wherein:
in a first uplink section, the plurality of channels are sequentially defined as the X first channels, the Z off channels, and the Y second channels; and
in a second uplink section subsequent to the first uplink section, the plurality of channels are sequentially defined as the Y second channels, the Z off channels, and the X first channels.

3. The electronic device of claim 1, wherein X is greater than Y.

4. The electronic device of claim 1, wherein:
M is equal to 2n, wherein n is a positive integer; and
X is equal to n.

5. The electronic device of claim 1, wherein:
M is 2n+1, wherein n is a positive integer; and
X is n+1.

6. The electronic device of claim 1, wherein:
a sensing area and a peripheral area are defined in the sensor layer; and
the X first channels overlap at least half of the sensing area.

7. The electronic device of claim 1, wherein:
a sensing area and a peripheral area are defined in the sensor layer; and
the Z off channels and the Y second channels together overlap less than a half of the sensing area.

8. The electronic device of claim 1, wherein, in the uplink section, both the uplink signal and the inverse phase signal are not provided to the Z off channels.

9. The electronic device of claim 1, wherein a first off channel operating as an off channel among the plurality of channels in a first uplink section and a second off channel operating as an off channel among the plurality of channels in a second uplink section subsequent to the first uplink section are different from each other.

10. The electronic device of claim 1, wherein X is greater than or equal to half of M and Y is less than the half of M.

11. The electronic device of claim 1, wherein Z is one or two.

12. The electronic device of claim 1, wherein:
the sensor layer includes a plurality of electrodes that each extends in a first direction and are arranged in a second direction intersecting the first direction and a plurality of cross electrodes that each extends in the second direction and are arranged in the first direction,
wherein each of the plurality of channels extends in the first direction and is arranged in the second direction and respectively corresponds to one of the plurality of electrodes.

13. The electronic device of claim 12, wherein the sensor driver is driven selectively in a first mode that detects a passive input based on a change in a mutual capacitance formed between the plurality of electrodes and the plurality of cross electrodes or a second mode that detects an active input based on a change in a capacitance of at least one of the plurality of electrodes and the plurality of cross electrodes.

14. The electronic device of claim 13, wherein each of the first mode and the second mode includes the uplink section.

15. An electronic device comprising:
a display layer that displays an image;
a sensor layer disposed on the display layer and sensing an external input, the sensor layer including a plurality of channels; and
a sensor driver that drives the sensor layer,
wherein, in each of uplink sections prior to determining that an input device is present, the sensor driver provides an uplink signal to a group of plurality of first channels that are continuously arranged and directly border each other, and provides an inverse phase signal having an inverse phase of the uplink signal to a group of plurality of second channels that are continuously arranged and directly border each other, the plurality of second channels are different from the plurality of first channels, and the sensor driver does not provide the uplink signal and the inverse phase signal to off channels that are sequentially arranged among the plurality of channels and directly border each other and are positioned to directly border the group of the plurality of first channels and directly border the group of the plurality of second channels,
wherein the uplink sections include a first uplink section and a second uplink section subsequent to the first uplink section, and wherein in the first uplink section, the plurality of channels are sequentially defined as the plurality of first channels, the off channels, and the plurality of second channels, and in the second uplink section, the plurality of channels are sequentially defined as the plurality of second channels, the off channels, and the plurality of first channels.

16. The electronic device of claim 15, wherein:
a number of the plurality of channels is equal to a sum of a number of the plurality of first channels, a number of the off channels, and a number of the plurality of second channels, and
wherein the number of the plurality of first channels is greater than the number of the plurality of second channels.

17. The electronic device of claim 15, wherein:
a number of the plurality of channels is 2n and a number of the plurality of first channels is n, wherein n is a positive integer; or
the number of the plurality of channels is 2n+1 and the number of the plurality of first channels is n+1, wherein n is the positive integer.

18. The electronic device of claim 15, wherein a number of the off channels is one or two.

19. The electronic device of claim 15, wherein the sensor layer includes a plurality of electrodes that each extends in a first direction and is arranged in a second direction intersecting the first direction and a plurality of cross electrodes that each extends in the second direction and is arranged in the first direction, and
wherein each of the plurality of channels extends in the first direction and is arranged in the second direction and respectively corresponds to one of the plurality of electrodes.

20. The electronic device of claim 19, wherein the sensor driver is driven selectively in a first mode that detects a passive input based on a change in a mutual capacitance formed between the plurality of electrodes and the plurality of cross electrodes or a second mode that detects an active input based on a change in a capacitance of at least one of the plurality of electrodes and the plurality of cross electrodes, and the first mode and the second mode include the uplink sections.

* * * * *